(12) United States Patent
Nakamura et al.

(10) Patent No.: US 7,875,117 B2
(45) Date of Patent: Jan. 25, 2011

(54) NITROGEN DOPED SILICON WAFER AND MANUFACTURING METHOD THEREOF

(75) Inventors: Kouzo Nakamura, Kanagawa (JP);
Susumu Maeda, Kanagawa (JP);
Kouichirou Hayashida, Kanagawa (JP);
Takahisa Sugiman, Kanagawa (JP);
Katsuhiko Sugisawa, Kanagawa (JP)

(73) Assignee: Sumco Techxiv Corporation, Kanagawa (JP)

( * ) Notice: Subject to any disclaimer, the term of this patent is extended or adjusted under 35 U.S.C. 154(b) by 199 days.

(21) Appl. No.: 11/573,387

(22) PCT Filed: Aug. 11, 2005

(86) PCT No.: PCT/JP2005/014773
§ 371 (c)(1),
(2), (4) Date: Feb. 7, 2007

(87) PCT Pub. No.: WO2006/016659
PCT Pub. Date: Feb. 16, 2006

(65) Prior Publication Data
US 2007/0218570 A1    Sep. 20, 2007

(30) Foreign Application Priority Data
Aug. 12, 2004   (JP)   ................. 2004-235645

(51) Int. Cl.
*C30B 29/06*   (2006.01)
(52) U.S. Cl. ............................ 117/14; 117/15; 117/201; 117/214; 117/932
(58) Field of Classification Search ............... 117/14, 117/15, 201, 214, 932
See application file for complete search history.

(56) References Cited

U.S. PATENT DOCUMENTS 6,162,708 A    12/2000   Tamatsuka et al.
6,191,009 B1   2/2001    Tamatsuka et al.

(Continued)

FOREIGN PATENT DOCUMENTS

CN    1395744    2/2003

(Continued)

OTHER PUBLICATIONS

Mikkelsen. Jr,. J.C. et al., "The Diffussivity and solubility of Oxygen in Silicon", *Materials Research Society Symposia Proceeding*, vol. 59, 1985.

(Continued)

*Primary Examiner*—Robert M Kunemund
(74) *Attorney, Agent, or Firm*—Occhiuti Rohlicek & Tsao LLP

(57) ABSTRACT

An epitaxial wafer and a high-temperature heat treatment wafer having an excellent gettering capability are obtained by performing epitaxial growth or a high-temperature heat treatment. A relational equation relating the density to the radius of an oxygen precipitate introduced in a silicon crystal doped with nitrogen at the time of crystal growth can be derived from the nitrogen concentration and the cooling rate around 1100° C. during crystal growth, and the oxygen precipitate density to be obtained after a heat treatment can be predicted from the derived relational equation relating the oxygen precipitate density to the radius, the oxygen concentration, and the wafer heat treatment process. Also, an epitaxially grown wafer and a high-temperature annealed wafer whose oxygen precipitate density has been controlled to an appropriate density are obtained, using conditions predicted by the method.

9 Claims, 20 Drawing Sheets

U.S. PATENT DOCUMENTS

| | | |
|---|---|---|
| 6,206,961 B1 * | 3/2001 | Takeno et al. .................. 117/20 |
| 7,413,964 B2 * | 8/2008 | Reynaud et al. ............. 438/455 |
| 2003/0015131 A1 | 1/2003 | Iida et al. |
| 2003/0203519 A1 | 10/2003 | Kihara et al. |
| 2004/0065250 A1 | 4/2004 | Komiya et al. |
| 2006/0046431 A1 * | 3/2006 | Blietz et al. ................. 438/455 |

FOREIGN PATENT DOCUMENTS

| | | |
|---|---|---|
| JP | 10-098047 | 4/1998 |
| JP | 10-208987 | 8/1998 |
| JP | 11-189493 | 7/1999 |
| JP | 11-322491 | 11/1999 |
| JP | 2000-044389 | 2/2000 |
| JP | 2000-211995 | 2/2000 |
| JP | 2000-211995 | 8/2000 |
| JP | 2000-264779 | 9/2000 |
| JP | 2001-68477 | 3/2001 |
| JP | 2001-503009 | 3/2001 |
| JP | 2001-503009 | 6/2001 |
| JP | 2001-270796 | 10/2001 |
| JP | 2001-284362 | 10/2001 |
| JP | 2002-012497 | 1/2002 |
| JP | 2002-118114 | 4/2002 |
| JP | 2002-134517 | 5/2002 |
| JP | 2002-299344 | 10/2002 |
| JP | 2002-353225 | 12/2002 |
| JP | 2003-073191 | 3/2003 |
| JP | 2003-318181 | 11/2003 |
| WO | WO 98/45507 | 10/1998 |
| WO | WO 01/55485 | 8/2001 |
| WO | WO 02/49091 | 6/2002 |

OTHER PUBLICATIONS

Nakamura, K. et al., "Relationship between the COP and Oxygen Precipitates Free zone in High Temperature Annealed CZ-Si Crystal", *The Japan Society of Applied physics, Annual Meeting Digest*, No. 1, 24p-YK-4, pp. 381, 2002.

International Search Report, PCT/JP2005/014773, Nov. 2005.

* cited by examiner

FIG. 17A    (a) EPITAXIAL WAFER
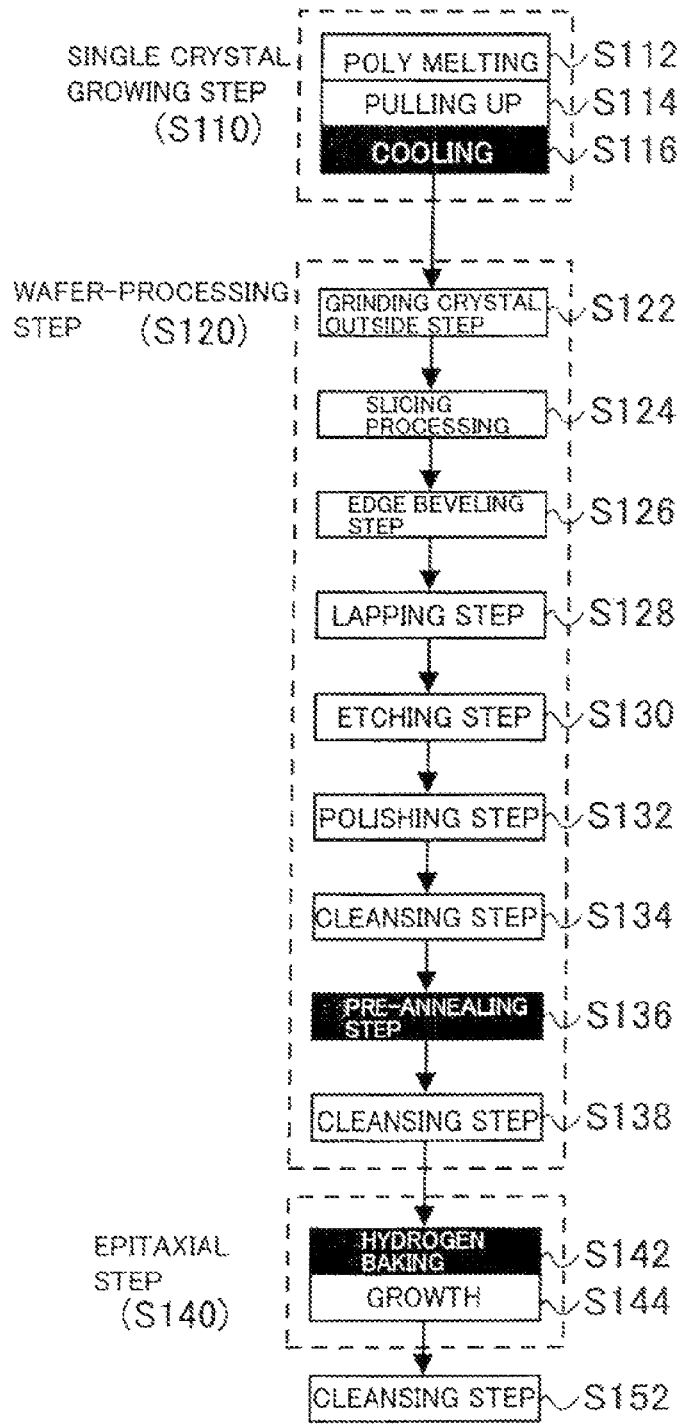

FIG. 19A

PRE-ANNEALING + EPITAXIAL

| No. | OXYGEN CONCENTRATION × 10¹⁷ atoms/cm³ | NITROGEN CONCENTRATION × 10¹⁴ atoms/cm³ | PRE-ANNEALING TEMPERATURE °C | PRE-ANNEALING TIME min | MEASURED BMD DENSITY × 10⁹ units/cm³ | PREDICTED BMD DENSITY × 10⁹ units/cm³ | JUDGMENT |
|---|---|---|---|---|---|---|---|
| 1 | 11 | 0.3 | 850 | 1 | 0.3 | 0.2 | × |
| 2 | 11 | 0.3 | 850 | 2 | 2.0 | 1.5 | ○ |
| 3 | 13 | 0.3 | 850 | 1 | 1.5 | 1.6 | ○ |
| 4 | 13 | 0.3 | 850 | 2 | 1.5 | 1.6 | ○ |
| 5 | 11 | 0.3 | 750 | 2 | 0.1 | 0.1 | × |
| 6 | 11 | 0.3 | 750 | 10 | 0.1 | 0.2 | × |
| 7 | 13 | 0.3 | 750 | 2 | 0.1 | 0.2 | × |
| 8 | 13 | 0.3 | 750 | 10 | 0.7 | 0.6 | ○ |
| 9 | 11 | 1.0 | 750 | 1 | 0.8 | 0.6 | ○ |
| 10 | 11 | 1.0 | 750 | 2 | 0.6 | 0.7 | ○ |
| 11 | 13 | 1.0 | 750 | 1 | 0.8 | 0.9 | ○ |
| 12 | 13 | 1.0 | 750 | 2 | 0.7 | 0.9 | ○ |

FIG. 19B

| OTHER CONDITIONS | | |
|---|---|---|
| COOLING RATE AROUND 1100 °C FOR CRYSTAL USED | 3.5°C/min |
| CONDUCTIVE TYPE, RESISTIVITY | p-TYPE, 10Ωcm |
| EPI-LAYER THICKNESS | 5 μm |
| EPI GROWTH TEMPERATURE | 1130°C |
| H2 BAKING CONDITIONS | 1180°C × 45 seconds |

FIG. 20A

HYDROGEN BAKING + EPITAXIAL

| CLASSIFICATION | No. | NITROGEN CONCENTRATION ×10¹⁴ atoms/cm³ | HYDROGEN BAKING TEMPERATURE (°C), TIME (min) | MEASURED BMD DENSITY ×10⁹ units/cm³ | PREDICTED BMD DENSITY ×10⁹ units/cm³ | JUDGMENT |
|---|---|---|---|---|---|---|
| COMPARATIVE EXPERIMENT EXAMPLE | 1 | 0.5 | 1150, 2.0 | 0.4 | 0.35 | × |
| | 2 | 1 | 1200, 1.0 | 0.4 | 0.48 | × |
| | 3 | 0.5 | 1200, 1.0 | 0.24 | 0.19 | × |
| | 4 | 1 | 1230, 1.0 | 0.33 | 0.3 | × |
| EXPERIMENT EXAMPLE | 5 | 0.7 | 1150, 2.0 | 0.78 | 0.65 | ○ |
| | 6 | 1.5 | 1200, 1.0 | 0.77 | 0.86 | ○ |
| | 7 | 2 | 1230, 1.0 | 0.89 | 0.77 | ○ |

FIG. 20B

| OTHER CONDITIONS | |
|---|---|
| COOLING RATE AROUND 1100°C FOR CRYSTAL USED | 3.5°C/min |
| OXYGEN CONCENTRATION OF WAFER USED | $12.0 \times 10^{17}$ atoms/cm$^3$ |
| CONDUCTIVE TYPE, RESISTIVITY | p-TYPE, 10Ωcm |
| EPI-LAYER THICKNESS | 5 μm |
| EPI GROWTH TEMPERATURE | 1130°C |

FIG. 21A

PRE-ANNEALING + HIGH-TEMPERATURE ANNEALING

| CLASSIFICATION | No. | NITROGEN CONCENTRATION ×10$^{14}$ atoms/cm$^3$ | PRE-ANNEALING TEMPERATURE (°C), TIME (min) | MEASURED BMD DENSITY ×10$^9$ units/cm$^3$ | PREDICTED BMD DENSITY ×10$^8$ units/cm$^3$ | JUDGMENT |
|---|---|---|---|---|---|---|
| COMPARATIVE EXPERIMENT EXAMPLE | 1 | 0.1 | 650, 30 | 0.39 | 0.34 | × |
| | 2 | 0.1 | 700, 30 | 0.41 | 0.39 | × |
| | 3 | 0.1 | 750, 10 | 0.4 | 0.43 | × |
| EXPERIMENT EXAMPLE | 4 | 0.3 | 750, 60 | 3.5 | 2.73 | ○ |
| | 5 | 0.3 | 800, 60 | 2.0 | 1.77 | ○ |
| | 6 | 0.3 | 850, 60 | 2.0 | 1.5 | ○ |
| | 7 | 1.0 | 850, 60 | 5.0 | 4.9 | ○ |

FIG. 21B

OTHER CONDITIONS

| COOLING RATE AROUND 1100°C FOR CRYSTAL USED | | 3.5°C/min |
|---|---|---|
| OXYGEN CONCENTRATION OF WAFER USED | | 12.0×10$^{17}$ atoms/cm$^3$ |
| CONDUCTIVE TYPE, RESISTIVITY | | p-TYPE, 10Ωcm |
| HIGH-TEMPERATURE ANNEALING TEMPERATURE | | 1200°C |
| HIGH-TEMPERATURE ANNEALING TIME | | 1H |
| TEMPERATURE RAMP RATE | 800–1000 | 10°C/min |
| | 1000–1100 | 2°C/min |
| | 1100–1200 | 1°C/min |

FIG. 22A

RAMP RATE + HIGH-TEMPERATURE ANNEALING

| CLASSIFICATION | No. | NITROGEN CONCENTRATION ×10$^{14}$ atoms/cm$^3$ | TEMPERATURE RAMP RATE FROM 800°C TO 1000°C (°C/min) | MEASURED BMD DENSITY ×10$^9$ units/cm$^3$ | PREDICTED BMD DENSITY ×10$^9$ units/cm$^3$ | JUDGMENT |
|---|---|---|---|---|---|---|
| COMPARATIVE EXPERIMENT EXAMPLE | 1 | 0.2 | 30 | 0.48 | 0.46 | × |
|  | 2 | 0.1 | 20 | 0.31 | 0.21 | × |
|  | 3 | 0.1 | 10 | 0.3 | 0.28 | × |
| EXPERIMENT EXAMPLE | 4 | 0.3 | 10 | 2 | 1.3 | ○ |
|  | 5 | 1 | 10 | 4.8 | 4.9 | ○ |
|  | 6 | 1.5 | 30 | 4.5 | 4.9 | ○ |

FIG. 22B

| OTHER CONDITIONS | | |
|---|---|---|
| COOLING RATE AROUND 1100°C FOR CRYSTAL USED | | 3.5°C/min |
| OXYGEN CONCENTRATION OF WAFER USED | | $12.0 \times 10^{17}$ atoms/cm$^3$ |
| CONDUCTIVE TYPE, RESISTIVITY | | p-TYPE, 10Ωcm |
| HIGH-TEMPERATURE ANNEALING TEMPERATURE | | 1200°C |
| HIGH-TEMPERATURE ANNEALING TIME | | 1H |
| TEMPERATURE RAMP RATE | 1000–1100°C | 2°C/min |
| | 1000–1200°C | 1°C/min | ns of the page.

NITROGEN DOPED SILICON WAFER AND MANUFACTURING METHOD THEREOF

CROSS-REFERENCE TO RELATED APPLICATIONS

This application is the National Stage of International Application No. PCT/JP2005/014773, filed on Aug. 11, 2005, which claims the benefit of Japan Application Serial No. 2004-235645, filed on Aug. 12, 2004.

TECHNICAL FIELD

The present invention relates to a method for manufacturing a silicon wafer with controlled crystal defects, obtained by growing a silicon single crystal ingot from molten silicon doped with nitrogen and cutting a wafer from it, and a silicon wafer obtained by this method.

BACKGROUND ART

With the trend towards higher levels of integration and further miniaturization of a semiconductor circuits, crystal defects formed at the time of crystal growth existing near the surface layer of a silicon wafer can have a great effect on device performance. In general, crystal defects that degrade device characteristics are of the following three kinds.
1. Void defects that occur as a result of aggregation of vacancies
2. Oxidation Induced Stacking Faults (OSF)
3. Dislocation clusters that occurs as a result of aggregation of interstitial silicon In order to obtain a silicon wafer that does not include the above crystal defects formed at the time of crystal growth near the surface layer where a device circuit is manufactured, the following methods have been devised.
1.) To manufacture defect-free single crystal ingots by controlling the crystal growth conditions
2.) To eliminate void defects near the surface layer of the wafer by high-temperature annealing
3.) To grow a defect-free layer on the surface of a wafer by epitaxial growth Although the above methods 1) to 3) can prevent the problem of crystal defects, none of these methods is necessarily preferable for the control of oxygen precipitates. Because oxygen precipitates (bulk micro defect: BMD) play an important role as gettering sites against harmful heavy-metal contamination incidentally occurring in the device circuit manufacturing process, they are preferably generated at an appropriate density in the heat treatment in the device circuit manufacturing process. However, the conditions selected for restricting crystal defects in the above methods 1) to 3) are often disadvantageous for the generation of BMDs. To begin with, BMD control in 1), 2) and 3) is described.

When a defect-free single crystal ingot in 1) is to be manufactured, the oxygen concentration needs to be lowered to prevent OSFs from occurring. However, under a low oxygen concentration conditions, it is difficult to obtain sufficient BMD density by a normal heat treatment. Also, the crystal in the defect-free single crystal ingot is in a state wherein a vacancies-dominant defect-free portion and an interstitial silicon-dominant defect-free portion coexist in a radial direction, and the oxygen precipitate characteristics are totally different between these portions. Accordingly, a post-treatment to ensure uniform oxygen precipitate characteristics within the silicon wafer surface is need din some cases. As a post-treatment for uniform oxygen precipitate characteristics, a method of eliminating such precipitate characteristics in an as-grown state by a rapid high-temperature heating treatment has been proposed (for example, Patent Documents 1 and 2). Also, a method to make uniform the BMD density by a heat treatment that strongly effects nuclear generation on the low-temperature side that is not influenced by the dominant point defect kind has been proposed (for example, Patent Document 3 and 4). However, the former method requires a rapid high-temperature heating treatment, which is a high-cost process, and the latter method requires a long-time heat treatment process, by which it is possible to density and make uniform the BMDs but it is very difficult to control the density to a selected density. Thus, the defect-free single crystal ingot is actually used only for limited applications that do not require gettering by the BMDs.

Next, a high-temperature annealed wafer in 2) is described. Void defects near the surface are eliminated by a heat treatment typically for one hour at 1200° C. under a non-oxidizing atmosphere such as hydrogen and argon. However, the voids in a normal crystal that are eliminated by annealing are only those on the outermost surface layer of the wafer, and in order to create a void defect free area deeper than the device manufacturing area, it is very important to minimize the size of the voids so that they can be eliminated easily (for example, Patent Document 5 shown below). However, in order to create a void defect free area that is deep enough, merely minimizing the void defects is not sufficient, but lowering the oxygen concentration is also strongly desired (for example, Non-Patent Document 1 shown below). This is because the inner wall of the void is covered with an oxide film in an as-grown state, and the shrinkage of the void defects starts after the inner wall oxide film is dissolved and eliminated. That is, as the depth which is sufficient for the inner wall oxide film to be dissolved and eliminated by the oxygen outward diffusion effect depends on the oxygen concentration of the crystal, the depth is shallow in crystals with a high oxygen concentration. Thus, in order to obtain a sufficient void defect free layer depth, lowering the oxygen concentration of the crystal is very important. However, it is generally difficult for a crystal with a low oxygen concentration to have sufficient BMD density.

Further, an epitaxially grown wafer in 3) is described. The epitaxially grown wafer is advantageous in the voids present in the substrate wafer are not transcribed on the epitaxial layer, and a defect-free silicon layer can be obtained on the surface layer. However, since the wafer temperature is raised in a short time to a high temperature for epitaxial growth in consideration of the productivity, as-grown micro nuclei that becomes BMD nuclei disappear, and it is very likely that sufficient BMD density will not be obtained even if a heat treatment is applied thereafter.

In consideration of the above described situation concerning high-temperature annealed wafers and epitaxial wafers, a method of nitrogen doping has been proposed. First, the effect of nitrogen doping on the high-temperature annealed wafer is described. Using a crystal whose void defect size has been reduced by doping nitrogen as a crystal for high-temperature annealing has been proposed (for example, Patent Document 6 shown below). Also, although it is traditionally known that abnormal BMDs are generated in nitrogen-doped CZ silicon crystals, it has been shown that controlling the nitrogen concentration can result in BMDs with appropriate density (for example, Patent Document 7 shown below). This document shows that $1\times10^9$ units/cm$^3$ or more BMD density can be obtained when the nitrogen concentration of even a crystal with low oxygen concentration is set to $1\times10^{13}$ atoms/cm$^3$ or more. Many similar inventions to this exist, but they describe only the nitrogen concentration as a factor to control the BMD density of a high-temperature annealed wafer (for example, Patent Documents 7, 8, 9 and 10 shown below). However, the BMD density is determined not only be nitrogen concentration but by the temperature increase rate in each temperature range at the time of high-temperature annealing (for example, Patent Document 11 shown below). However, the range defined in this document includes all condition ranges to be selected generally, and this document does not disclose a method for controlling the BMDs individually. Also, a method of obtaining an appropriate BMD density by performing annealing for 60 minutes or more at a temperature of 700° C. or more and 900° C. or less as a heat treatment before high-temperature annealing or by setting the thermal annealing rate in a temperature range from 700° C. or more to 900° C. or less to 3° C./minute or less in the thermal annealing step of high-temperature annealing has been proposed (for example, Patent Document 12 shown below). However, the BMDs are not controlled only by this definition, and a comprehensive method for controlling the BMDs has not been disclosed.

Next, a nitrogen doping technique proposed for an epitaxially grown wafer is described. As for the epitaxially grown wafer, it is likely that oxygen precipitate nuclei will disappear in the epitaxial growth process. In contrast, it if shown that $5 \times 10^3$ units/cm$^3$ or more BMD density is observed even after epitaxial growth when doping with $1 \times 10^{13}$ atoms/cm$^3$ or more nitrogen (for example, Patent Document 13 shown below). this may be because, in the nitrogen-doped crystal, generation of as-grown nuclei starts during crystal growth at a higher temperature than in a normal crystal, and they grow at the high temperature and form large-sized nuclei. It is thought that these large-sized nuclei do not disappear even in the epitaxial growth process. However, this BMD density is not necessarily preferable. It is shown that, although the BMD density after epitaxial growth is greatly influenced by nitrogen concentration, is also influenced by the annealing process time at a high temperature before the epitaxial growth process (for example, Patent Document 14 shown below). The annealing process before the epitaxial growth means an $H_2$ or HCl baking process at an equal or higher temperature than the epitaxial growth temperature generally for the purpose of elimination of natural oxide films. Meanwhile, it is shown that the BMD density observed after the epitaxial growth is influenced by the cooling rates in two temperature ranges, that is, a cooling rate from 1150° C. to 1020° C. and a cooling rate from 1000° C. to 900° C., in the crystal growth process (for example, Patent Document 15 shown below). The effects of the cooling rates in the two temperature ranges are as follows. The temperature range from 1150° C. to 1020° C. is a temperature range for the generation and growth of void defects, and since rapid cooling in this temperature range restrains the absorption of vacancies in voids, the concentration of residual vacancies is raised, and subsequent BMD nucleus generation is promoted. The temperature range from 1000° C. to 900° C. is regarded as a temperature range in which the BMDs are generated in a nitrogen-doped crystal, and slow cooling in this temperature range increases the BMD density, according to this document. This document recommends that the cooling rate from 1150° C. to 1020° C. be 2.7° C./minute or more, and the cooling rate from 1000° C. to 900° C. be 1.2° C./minute or less, in order to obtain sufficient BMD density. However, it says the effect of the cooling rate in the temperature range from 1000° C. to 900° C. is slight, and the effect of the cooling rate from 1150° C. to 1020° C. is significant. However, the relation of these with the nitrogen concentration and other factors is not described clearly (Patent Document 15 shown below). It has been proposed that the BMD density after the epitaxial growth is further controlled by performing pre-annealing for 15 minutes or more and 4 hours or less at a temperature of 700° C. or more and 900° C. or less before the epitaxial growth process (for example, Patent Document 16 shown below).

As described above, it is clear the BMD density of a nitrogen-doped silicon wafer after the epitaxial process depends on 1) the nitrogen concentration, 2) the crystal thermal history, 3) the temperature and time of a high-temperature heat treatment performed for elimination of natural oxide films in the epitaxial process, 4) the temperature and time of pre-annealing performed before the epitaxial process, and 5) the oxygen concentration, as a matter of course.

The BMD density of a nitrogen-doped silicon wafer after the high-temperature annealing process depends on 1) the nitrogen concentration, 2) the crystal thermal history, 3) the thermal annealing rate during the high-temperature annealing process, 4) the temperature and time of pre-annealing performed before the high-temperature annealing process, and 5) the oxygen concentration. Although it is known that the BMD density depends on these many factors simultaneously, the effect of these factors has only partially been clarified, as described above. As the nitrogen has a small segregation coefficient in the nitrogen-doped crystal, the nitrogen concentration exhibits significant changes in the axial direction of the crystal. Also, as the BMDs of the nitrogen-doped crystal depend on large as-grown oxygen precipitate nuclei generated in the cooling process during the crystal growth, they are strongly influenced by the thermal history during crystal growth. The growth process of the as-grown nuclei to visible size strongly influenced by nitrogen concentration and thermal history have not been clarified, and thus it has been conventionally necessary to control the nitrogen doping amount and the heat treatment process for obtaining an appropriate BMD density for each crystal growth condition and for each process.

Patent Document 1: Japanese Unexamined Patent Application Publication No. 2001-503009
Patent Document 2: Japanese Unexamined Patent Application Publication No. 2002-299344
Patent Document 3: Japanese Unexamined Patent Application Publication No. 2000-264779
Patent Document 4: Japanese Unexamined Patent Application Publication No. 2002-134517
Patent Document 5: Japanese Unexamined Patent Application Publication No. H10-208987
Patent Document 6: Japanese Unexamined Patent Application Publication No. H10-98047
Patent Document 7: Japanese Unexamined Patent Application Publication No. 2000-211995
Patent Document 8: Japanese Unexamined Patent Application Publication No. H11-322491
Patent Document 9: Japanese Unexamined Patent Application Publication No. 2001-270796
Patent Document 10: Japanese Unexamined Patent Application Publication No. 2001-284362
Patent Document 11: Japanese Unexamined Patent Application Publication No. 2002-118114
Patent Document 12: Japanese Unexamined Patent Application Publication No. 2002-353225
Patent Document 13: Japanese Unexamined Patent Application Publication No. H11-189493
Patent Document 14: Japanese Unexamined Patent Application Publication No. 2000-044389
Patent Document 15: Japanese Unexamined Patent Application Publication No. 2002-012497

Patent Document 16: Japanese Unexamined Patent Application Publication No. 2003-73191

Non-Patent Document 1: K. Nakamura, T. Saishoji, and J. Tomioka; The 63$^{rd}$ JSAP (The Japan Society of Applied Physics) Annual Meeting Digest, Autumn 2002; P. 381; No. 1 24p-YK-4

DISCLOSURE OF THE INVENTION

Problems to be Solved by the Invention

It is an object of the present invention to provide a wafer manufacturing method to obtain an epitaxial wafer and a high-temperature heat treatment wafer having a high gettering capability by applying an appropriate heat treatment process to a silicon wafer cut from a single crystal ingot doped with nitrogen in a process of growing a semiconductor silicon single crystal and thereafter performing an epitaxial growth or a high-temperature heat treatment.

The BMD density of a nitrogen-doped silicon wafer after the epitaxial process depends on 1) the nitrogen concentration, 2) the crystal thermal history, 3) the temperature and time of a high-temperature heat treatment performed for elimination of natural oxide films in the epitaxial process, 4) the temperature and time of pre-annealing performed before the epitaxial process, and 5) the oxygen concentration. The BMD density of a nitrogen-doped silicon wafer after the high-temperature annealing process depends on 1) the nitrogen concentration, 2) the crystal thermal history, 3) the temperature increase rate during the high-temperature annealing process, 4) the temperature and time of pre-annealing performed before the high-temperature annealing process, and 5) the oxygen concentration. Although it is known that the BMD density depends on these many factors simultaneously, the effect of these factors has only partially been clarified, as described above. Thus, it is extremely difficult to determine the conditions for obtaining a BMD density with sufficient gettering capability (e.g., $5 \times 10^8$ units/cm$^3$) at a good yield ratio. The present invention proposes a method for deriving a relational equation relating the density to the size of a BMD introduced in a silicon crystal doped with nitrogen at the time of crystal growth from nitrogen concentration and a cooling rate around 1100° C. during crystal growth, a method for predicting the BMD density to be obtained after a heat treatment from the derived relational equation relating the BMD density to the radius, oxygen concentration, and the wafer heat treatment process, and a method for manufacturing an epitaxially grown wafer and a high-temperature annealed wafer whose BMD density is controlled to have an excellent gettering capability by using the method.

Means for Solving the Problems

It is thought that large as-grown oxygen precipitate nuclei exist in a nitrogen-doped crystal, and as they are stable under high temperature, they act as BMD nuclei in epitaxially grown wafers and a high-temperature annealed wafers. The present invention proposes a method for deriving a relational equation relating the density to the radius of an oxygen precipitate introduced in a silicon crystal doped with nitrogen at the time of crystal growth form the nitrogen concentration and the cooling rate around 1100° C. during crystal growth, a method for predicting the oxygen precipitate density to be obtained after a heat treatment from the derived relational equation relating the oxygen precipitate density to the radius, oxygen concentration, and a wafer heat treatment process, and a method for manufacturing an epitaxially grown wafer and a high-temperature annealed wafer whose oxygen precipitate density has been controlled to an appropriate density, using conditions predicted by the method.

First, a method for deriving a relational equation relating the density to the size of an oxygen precipitate introduced in a silicon crystal doped with nitrogen at the time of crystal growth from the nitrogen concentration and the cooling rate around 1100° C. during crystal growth is described. In order to derive the relational equation, the following experiment was performed.

First, crystals with various nitrogen concentrations grown with various thermal histories were prepared. They were heated to a predetermined temperature by a rapid thermal annealing apparatus, and after precipitates smaller than a critical nucleus radius to exist at the temperature were eliminated, they underwent a heat treatment for 4 hours at 900° C. and thereafter a heat treatment for 16 hours at 1000° C., and nuclei remaining after the rapid thermal annealing process were grown to an observable size by the heat treatments. It is well known that no nucleus is generated in a CZ silicon crystal under a heat treatment at 900° C. or higher, and the BMD density that became apparent after the treatment for 4 hours at 900° C. and the treatment for 16 hours at 1000° C. is the density of the BMDs remaining at the temperature reached by the rapid thermal annealing apparatus, that is, the density of the nuclei larger than the critical nucleus radius at the heating temperature among the as-grown nuclei. Thus, by evaluating the relation between the heating temperature during rapid thermal annealing and the density observed after this process, the size distribution of the as-grown nuclei can be predicted. FIG. 1 shows the relation between a heating temperature and BMD density when the oxygen concentration is $12 \times 10^{17}$ atoms/cm$^3$, and when the nitrogen concentration is changed under the same growth conditions. It shows that the higher the nitrogen concentration is, the higher the BMD density is, and it also shows the BMD is still stable at higher temperatures. Next, a method for deriving the size distribution of the as-grown nuclei form the data in FIG. 1 is explained.

In general, the relation between the heating temperature and a critical nucleus radius is expressed by Equation 1).

Equation 1

$$Rcri = 2\sigma\Omega/k_B T \ln(Co/Co^{eq}) \qquad 1)$$

Rcri is a critical nucleus radius, $\sigma$ is the surface energy between SiO$_2$ and silicon, $\Omega$ is volume of SiO$_2$ per oxygen atom, $k_B$ is the Boltzmann constant, T is the absolute temperature, Co is the oxygen concentration, and Co$^{eq}$ is the thermal equilibrium concentration of oxygen. If the temperature on the horizontal axis in FIG. 1 is replaced with the critical nucleus radius by Equation 1), FIG. 1 will show the size distribution of the as-grown nuclei. However, it is not necessarily proper to directly replace the temperature on the horizontal axis in FIG. 1 with the critical nucleus radius. This is because the as-grown nuclei in the nitrogen-doped crystal are extremely large, even the nuclei smaller than the critical nucleus radius may remain because they take time to disappear, and not all the remaining nuclei are as-grown nuclei larger than the critical nucleus radius. Then, a process simulation of the heating experiment in FIG. 1 was performed, and the radius of the nuclei that can remain in the experiment at each set temperature was derived by numerical calculation. The method of numerical calculation is shown below. The change in the radius of the precipitate during the process when a precipitate having an arbitrary initial radius is heated in a temperature pattern in a heating experiment was numerically calculated using Equation 2) and 3).

Equation 2

$$dR/dt = D\Omega(Co - Co^1)/R \quad (2)$$

Equation 3

$$Co^1 = Co^{eq} \exp(2\sigma\Omega/Rk_BT) \quad (3)$$

Equation 2) expresses the rate of change of the radius, where R is the radius of the precipitate, D is the diffusion coefficient of oxygen, and $Co^1$ is the oxygen concentration at the interface of the precipitate, which is expressed by Equation 3). The minimum initial radius of a nucleus that does not disappear during the process when the calculation is carried out using these equations by setting the oxygen concentration and the temperature pattern and giving several initial radii has been defined as a process critical nucleus radius. The relation between the derived process critical nucleus radius and the BMD density is shown in FIG. 2. FIG. 2 shows the relation between the radius of an as-grown nucleus and the density of as-grown nuclei larger than the radius. It can be seen from FIG. 2 that the size distribution of the as-grown nuclei for each nitrogen concentration shifts in parallel. It can also be seen that, although nuclei having a smaller radius have a higher density, this tendency is saturated at a certain value, and the saturation density does not depend on the nitrogen concentration. This is explained as follows. Although FIG. 2 shows the relation between the radius of an as-grown nucleus and the total density of nuclei larger than the radius, it is clear that this relation can be rewritten to the relation in FIG. 2 when the normal size distribution is to be shown. That is, the size distribution of the as-grown nuclei in the nitrogen-doped crystal shifts to larger sizes as the nitrogen concentration increases, but a change in the total density is not observed. This means that, although the higher the nitrogen concentration, the higher the temperature at which the as-grown nuclei are generated, and thus the larger the size of the as-grown nuclei, but total density itself hardly changes. Next, nuclei whose density is not saturated were selected from the data in FIG. 2, and the relation among BMD density, nitrogen concentration, and the critical nucleus radius was analyzed using multivariate analysis. As a result, it was found that the relation is expressed as in the following equation.

Equation 4

$$BMD = 6.4 \times 10^{-19} N^{1.39} R^{-1.163} \quad (4)$$

Where BMD is the density of as-grown precipitates (units/cm³), N is the nitrogen concentration (atoms/cm³), and R is the radius of the as-grown precipitate. FIG. 4 shows a comparison between the calculated values based on Equation 4) and the actual measured values. It can be seen from FIG. 4 that the size distribution of the as-grown nuclei highly corresponds to the size distribution predicted from Equation 4).

Next, the relation with thermal history during crystal growth is shown. A similar experiment to FIG. 2 was carried out using crystals with different cooling rates in a temperature range for generation of void defects. While the cooling rate of the crystal around 1100° C. in FIG. 2 is 4° C./minute, FIGS. 5 and 6 show the relation between the critical nucleus radius and the BMD density in wafers with various nitrogen concentrations, setting the cooling rate of the crystal around 1100° C. to 1.5° C./minute and 2.0° C./minute, respectively. Each line shown in the figures is a calculation line derived by applying the corresponding nitrogen concentration amount to Equation 4) and is shown for comparison. It can be seen from the comparison with the calculation lines that Equation 4) is applicable regardless of the cooling rate of the crystal. Meanwhile, the saturation BMD density is lower as the cooling rate of the crystal is lower. The present inventors analyzed the relation between the saturation density and the cooling rate of the crystal further in detail and it is shown in FIG. 7. The relation in Equation 5) was found from FIG. 7.

Equation 5

$$\text{Saturation BMD density} = 7.5 \times 10^8 \, CR^{1.5} \quad (5)$$

Where CR is the cooling rate around 1100° C. during crystal growth (° C./minute). It is reported that the density of any defect, related to aggregation reaction of point defects, such as a void defects, interstitial silicon-type dislocation clusters and OSFs, is proportional to the cooling rate to the $1.5^{th}$ power. The relationship to a cooling rate to the $1.5^{th}$ power is thought to be a characteristic when nucleus generation is rate-controlled by the consumption of fast-diffused point defects. It can be seen from Equation 5) that the cooling rate must be 0.76° C./minute of faster in order for the saturation BMD density to exceed $5 \times 10^8$ units/cm³, which is a BMD density exerting sufficient gettering effects. Although Patent Document 15 states that the cooling rate from 1150° C. to 1020° C. needs to be 2.7° C./minute or faster in order to obtain a sufficient BMD density, it just states that such a cooling rate is needed in a specific nitrogen concentration and a specific epitaxial growth process.

Accordingly, it has become apparent that the relation relating the density to the size of an oxygen precipitate introduced in a silicon crystal doped with nitrogen at the time of crystal growth can be derived from the nitrogen concentration and a cooling rate around 1100° C. during crystal growth, using Equations 4) and 5).

Next, a method for predicting the oxygen precipitate density of an epitaxially grown wafer and a high-temperature annealed wafer to be obtained after a heat treatment from the derived relation is explained. As described above, the BMD density of a nitrogen-doped silicon wafer after the epitaxial process depends on 1) the nitrogen concentration, 2) the crystal thermal history, 3) the temperature and time of a high-temperature heat treatment performed for elimination of natural oxide films in the epitaxial process, 4) the temperature and time of pre-annealing performed before the epitaxial process, and 5) the oxygen concentration. On the other hand, high-temperature annealing is a process attempting to eliminate void defects near the surface layer and is performed at a temperature of 1100° C. or higher, and the BMD density of a nitrogen-doped silicon wafer after the high-temperature annealing process depends on 1) the nitrogen concentration, 2) the crystal thermal history, 3) a thermal annealing rate during the high-temperature annealing process, 4) the temperature and time of pre-annealing performed before the high-temperature annealing process, and 5) the oxygen concentration.

Then, by providing as initial values of the size and the density of the oxygen precipitates introduced in a silicon crystal doped with nitrogen at the time of crystal growth by Equations 4) and 5), and by process-simulating growth and disappearance of their as-grown nulcei in each of the above heat treatment processes by Equation 2), the density of the nuclei that remain after the processes can be derived. This is a similar calculation to one to derive FIG. 2 from FIG. 1. By this calculation, the density of the as-grown nuclei that remain after an arbitrary heat treatment processes can be derived.

By these procedures, the conditions for exceeding $5 \times 10^8$ units/cm³, which is the BMD density exerting sufficient gettering effects, can be selected easily. As described above, setting the cooling rate of the crystal at the time to 0.76° C./minute or faster is an important condition and is sometimes an essential condition.

Meanwhile, as for the physical parameters D and $Co^{eq}$ used for calculation, J. C. Mikkelesn Jr.'s values (J. C. Mikkelesn Jr., Proceeding of Material Research Society Symposium, Vol. 59 (1986) p 19) were used. Also, $\Omega$ is $2.21\times10^{-23}$ cm$^3$. As for $\sigma$, in the calculation in the present invention, one that is the most appropriate for expressing disappearance and growth of the BMD is selected from the results of various process simulations performed before in consideration of the temperature dependency. That is, $\sigma=575$ erg/cm$^2$ in the case of 800° C. or less, $\sigma=575+325(T° C.-800)/150$ erg/cm$^2$ in the case of 800° C. or more and 950° C. or less, $\sigma=900$ erg/cm$^2$ in the case of 950° C. or more and 1020° C. or more and 1100° C. or less, and $\sigma=730$ erg/cm$^2$ in the case of 1100° C. or more. As for the value $\sigma$, the value 310 erg/cm$^2$ is often used, but there is no established consensus about this, and there is a presumption that it is a very large value. However, if the same value is used for $\sigma$ to be used to derive the size distribution of as-grown nuclei and for $\sigma$ to be used to do a simulation regrading growth and disappearance of the as-grown nuclei in the heat treatment processes, there is no significant change in the predicted BMD result after the heat treatment processes.

Effects of the Invention

The present invention proposes a method for deriving a relational equation relating the density to the size of an oxygen precipitate introduced in a silicon crystal doped with nitrogen at the time of crystal growth from the nitrogen concentration and the cooling rate around 1100° C. during crystal growth, a method for predicting the BMD density to be obtained after a heat treatment form the derived relational equation relating the BMD density to the radius, the oxygen concentration, and the wafer heat treatment process, and a method for manufacturing an epitaxially grown wafer and a high-temperature annealed wafer whose BMD density has been controlled $5\times10^8$ units/cm$^3$ or more to have a sufficient gettering capability by using the method.

BRIEF DESCRIPTION OF THE DRAWINGS

FIG. 17A shows a manufacturing process of an epitaxial wafer used in the embodiments.

FIG. 19A shows the conditions and results of pre-annealing and epitaxial in Embodiment 5.

FIG. 19B shows other conditions in Embodiment 5.

FIG. 20A shows the conditions and results of hydrogen baking and epitaxial in Embodiment 6.

FIG. 20B shows other conditions in Embodiment 6.

FIG. 21A shows the conditions and results of pre-annealing and high-temperature annealing in Embodiment 7.

FIG. 21B shows other conditions in Embodiment 7.

FIG. 22A shows the conditions and results of ramp rate and high-temperature annealing in Embodiment 8.

FIG. 22B shows other conditions in Embodiment 8.

EXPLANATIONS OF THE NUMERALS

Figure 1:
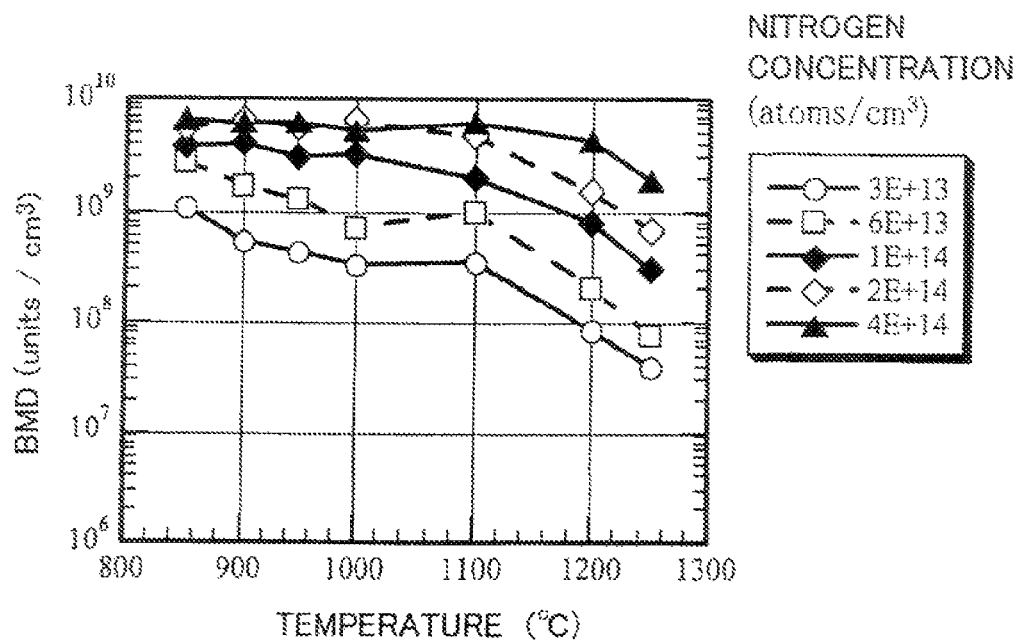
FIG. 1 shows the relation between the heating temperature and the BMD density in wafers with various nitrogen concentrations.
Figure 2:
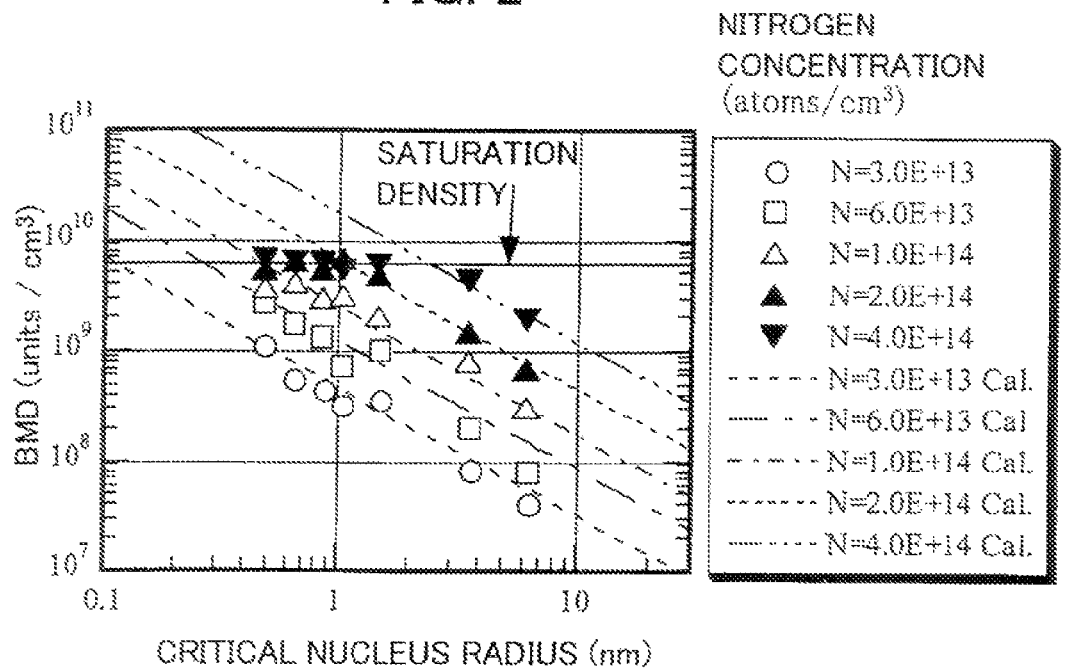
FIG. 2 shows the relation between the radius of an as-grown nucleus and the total density of nuclei larger than the radius.
Figure 3:
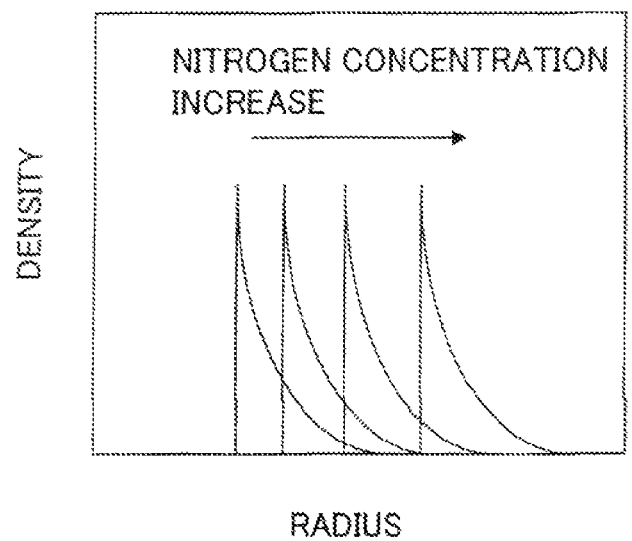
FIG. 3 is a schematic diagram showing the nitrogen concentration dependency of the size distribution of the as-grown nuclei.
Figure 4:
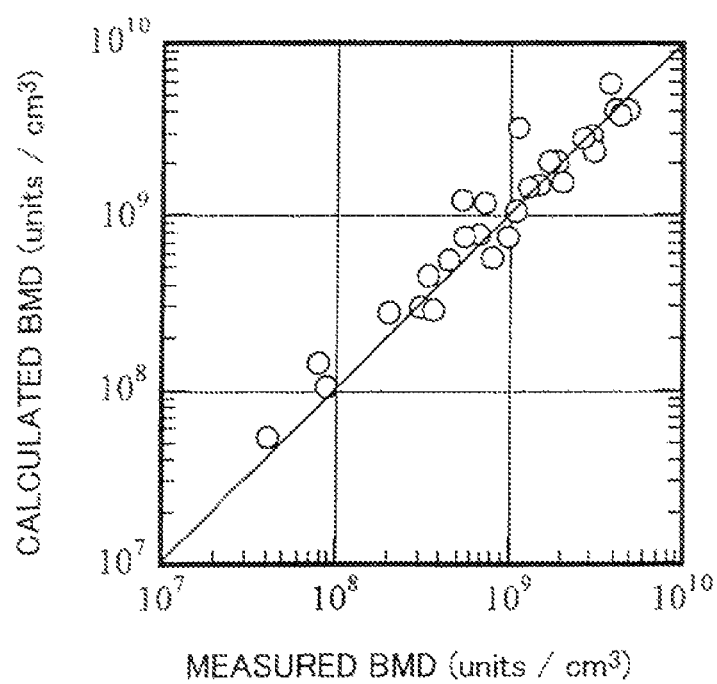
FIG. 4 shows a comparison between the densities of as-grown nuclei calculated based on a prediction equation and actual measured values.
Figure 5:
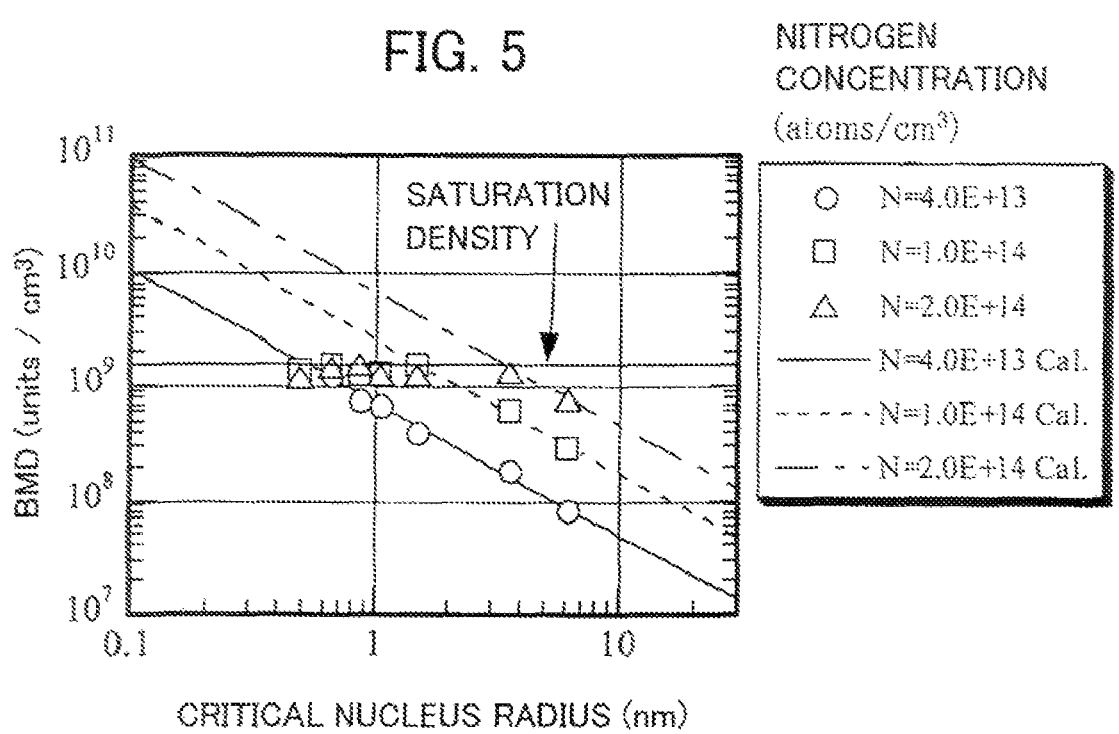
FIG. 5 shows the relation between the radius of an as-grown nucleus and the total density of nuclei larger than the radius when the cooling rate of the crystal around 1100° C. is set to 1.5° C./minute.
Figure 6:
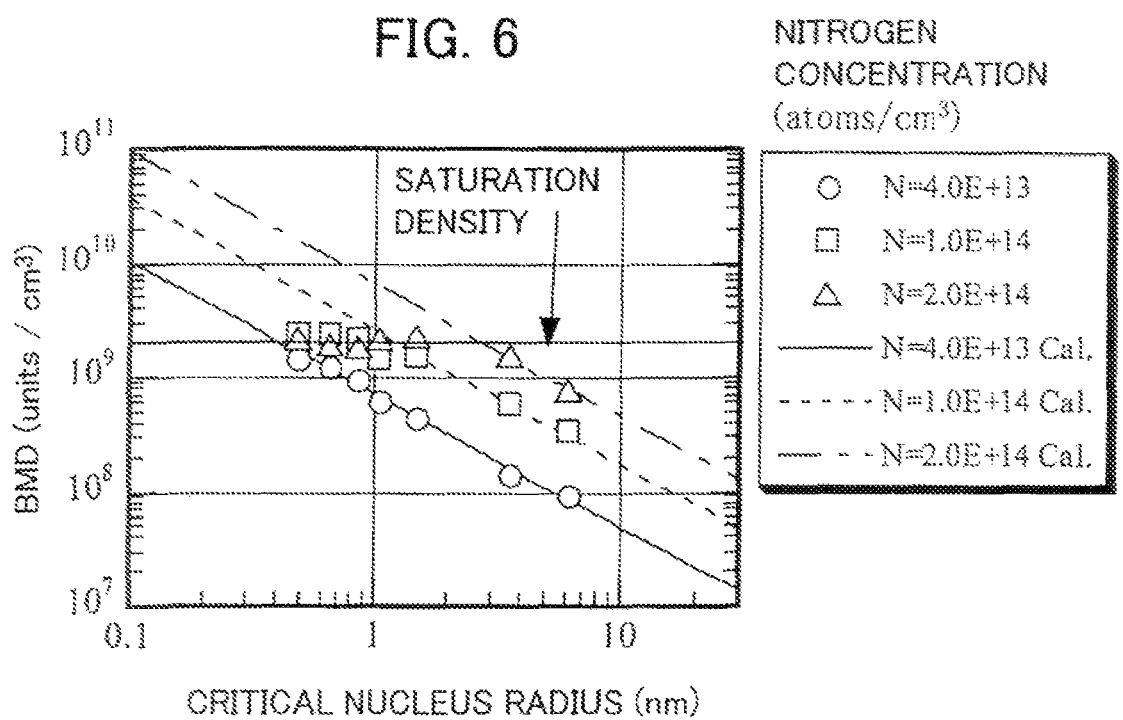
FIG. 6 shows the relation between the radius of an as-grown nucleus and the total density of nuclei larger than the radius when the cooling rate of the crystal around 1100° C. is set to 2.0° C./minute.
Figure 7:
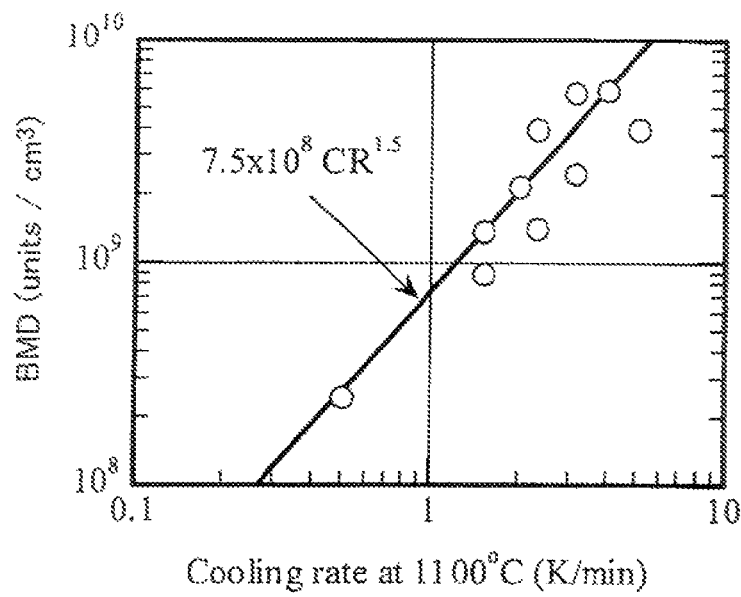
FIG. 7 shows the relation between the saturation BMD density and the cooling rate of the crystal around 1100° C.

S110: single crystal growing step
S120: processing step
S140: epitaxial step
S210: single crystal growing step
S220: processing step
S240: annealing step

PREFERRED MODE FOR CARRYING OUT THE INVENTION

The present invention proposes a method for deriving a relational equation relating the density to the radius of an oxygen precipitate introduced in a silicon crystal doped with nitrogen at the time of crystal growth from the nitrogen concentration and the cooling rate around 1100° C. during crystal growth, a method for predicting the oxygen precipitate density to be obtained after a heat treatment from the derived relational equation relating the oxygen precipitate density to the radius, the oxygen concentration, and the wafer heat treatment process, and a method for manufacturing an epitaxially gown wafer and a high-temperature annealed wafer whose oxygen precipitate density is controlled to an appropriate density, using conditions predicted by the method. Here, an appropriate oxygen precipitate density may mean a preferable or more preferable oxygen precipitate density based on the intended application of a silicon wafer to be manufactured. For example, for a silicon wafer for intrinsic gettering, the oxygen precipitate density is preferably $5 \times 10^8$ units/cm$^3$ or more, more preferably $8 \times 10^8$ units/cm$^3$ or more, and further preferably $1 \times 10^9$ units/cm$^3$ or more.

The calculation method is as follows: the size distribution of as-grown oxygen precipitates is provided as an initial value by Equation 4).

Then, the growth and disappearance of the nuclei having individual radii in the temperature processes in the epitaxial process and high-temperature annealing process are numerically calculated by Equations 2) and 3).

As a result, the density of the BMD nuclei that remain without disappearing is derived.

An embodiment to which the present invention has been applied is explained in further detail hereinafter. The BMD density of a nitrogen-doped silicon wafer after the epitaxial process depends on 1) the nitrogen concentration, 2) the crystal thermal history, 3) the temperature and time of a high-temperature heat treatment performed for elimination of natural oxide films in the epitaxial process, 4) the temperature and time of pre-annealing performed before the epitaxial process, and 5) the oxygen concentration. Also, the BMD density of a nitrogen-doped silicon wafer after the high-temperature annealing process depends on 1) the nitrogen concentration, 2) the crystal thermal history, 3) the thermal annealing rate during the high-temperature annealing process, 4) the temperature and time of pre-annealing preformed before the high-temperature annealing process, and 5) the oxygen concentration. Since the present invention provides a method for evaluating the influence of all of the above factors with respect to the BMD density, the conditions for obtaining an optimal BMD density can be selected.

The present invention provides the following, for example.

1) A method for deriving a relational equation relating the density of the radius of an oxygen precipitate introduced in a silicon crystal doped with nitrogen at the time of crystal growth from the nitrogen concentration and a cooling rate around 1100° C. during crystal growth, and predicting the oxygen precipitate density to be obtained after a heat treatment from the derived relational equation relating the oxygen precipitate density to the radius, the oxygen concentration, and the temperature process in epitaxial growth, and a method for obtaining an epitaxially grown wafer whose oxygen precipitate density is controlled to an appropriate density, using conditions predicted by the method.

2) A method for deriving a relational equation relating the density to the radius of an oxygen precipitate introduced in a silicon crystal doped with nitrogen at the time of crystal growth form the nitrogen concentration and a cooling rate around 1100° C. during crystal growth, and predicting the oxygen precipitate density to be obtained after a heat treatment form the derived relational equation relating the oxygen precipitate density to the radius, the oxygen concentration, and the temperature process in annealing at a temperature of 1100° C. or more, and a method for obtaining a wafer annealed at a temperature of 1100° C. or more whose oxygen precipitate density has been controlled to an appropriate density, using conditions predicted by the method.

3) A method for obtaining an epitaxially grown wafer whose oxygen precipitate density is $5 \times 10^8$ units/cm$^3$ or more, using conditions predicted by the above method 1), when a cooling rate around 1100° C. during crystal growth is set to 0.76° C./minute or faster.

4) A method for obtaining an epitaxially grown wafer whose oxygen precipitate density is $5 \times 10^8$ units/cm$^3$ or more, setting the maximum temperature and time in the epitaxial growth process as predicted by the above method 1), when a cooling rate around 1100° C. during crystal growth is set to 0.76° C./minute or faster.

5) A method for obtaining an epitaxially grown wafer whose oxygen precipitate density is $5 \times 10^8$ units/cm$^3$ or more, setting a temperature and time of a heat treatment performed before the epitaxial growth process as predicted by the above method 1), when a cooling rate around 1100° C. during crystal growth is set to 0.76° C./minute or faster.

6) A method for obtaining a wafer annealed at a temperature of 1100° C. or more whose oxygen precipitate density is $5 \times 10^8$ units/cm$^3$ or more, using conditions predicted by the above method 2), when a cooling rate around 1100° C. during crystal growth is set to 0.76° C./minute or faster.

7) A method for obtaining a wafer annealed at a temperature of 1100° C. or more whose oxygen precipitate density is $5 \times 10^8$ units/cm$^3$ or more, setting a temperature and time of a heat treatment performed before annealing at a temperature of 1100° C. or more as predicted by the above method 2), when a cooling rate around 1100° C. during crystal growth is set to 0.76° C./minute or faster.

8) A method for obtaining a wafer annealed at a temperature of 1100° C. or more whose oxygen precipitate density is $5 \times 10^8$ units/cm$^3$ or more, setting a thermal annealing rate in the thermal annealing process at 700° C. or more and 900° C. or less in the annealing process to a temperature of 1100° C. or more as predicted by the above method 2), when a cooling rate around 1100° C. during crystal growth is set to 0.76° C./minute or faster.

Embodiments

Hereinafter, the present invention is described further in detail based on the embodiments.

Embodiment 1

An example of predicting the BMD density to be obtained in a case where a wafer manufactured from a crystal whose cooling rate around 1100° C. during crystal growth is 3.5° C./minute undergoes an epitaxial growth process is shown. Here, the effects of the nitrogen concentration and the temperature and time of a high-temperature pre-process (hereinafter referred to as "hydrogen baking process" in some cases) performed to eliminate natural oxide films before the epitaxial growth are predicted by a method according to the present invention.

Figure 8:
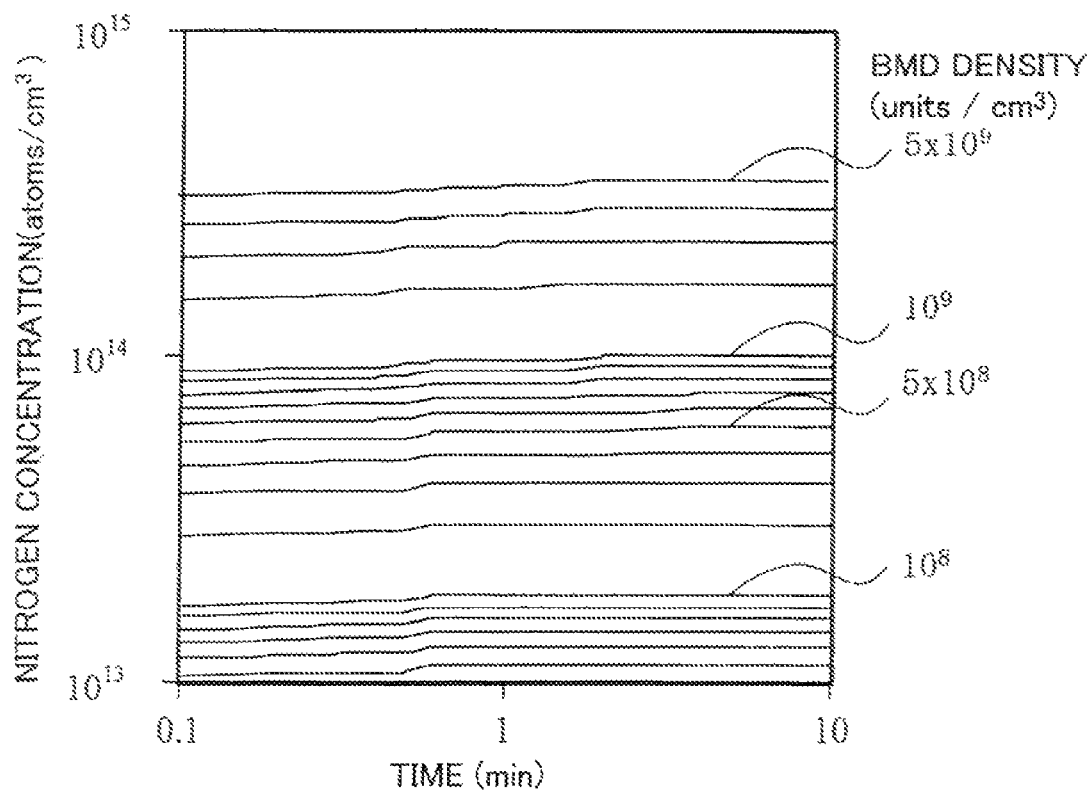
FIG. 8 shows the relation between the BMD density and the nitrogen concentration and time when the baking temperature in an epitaxial growth process is set to 1150° C.
Figure 9:
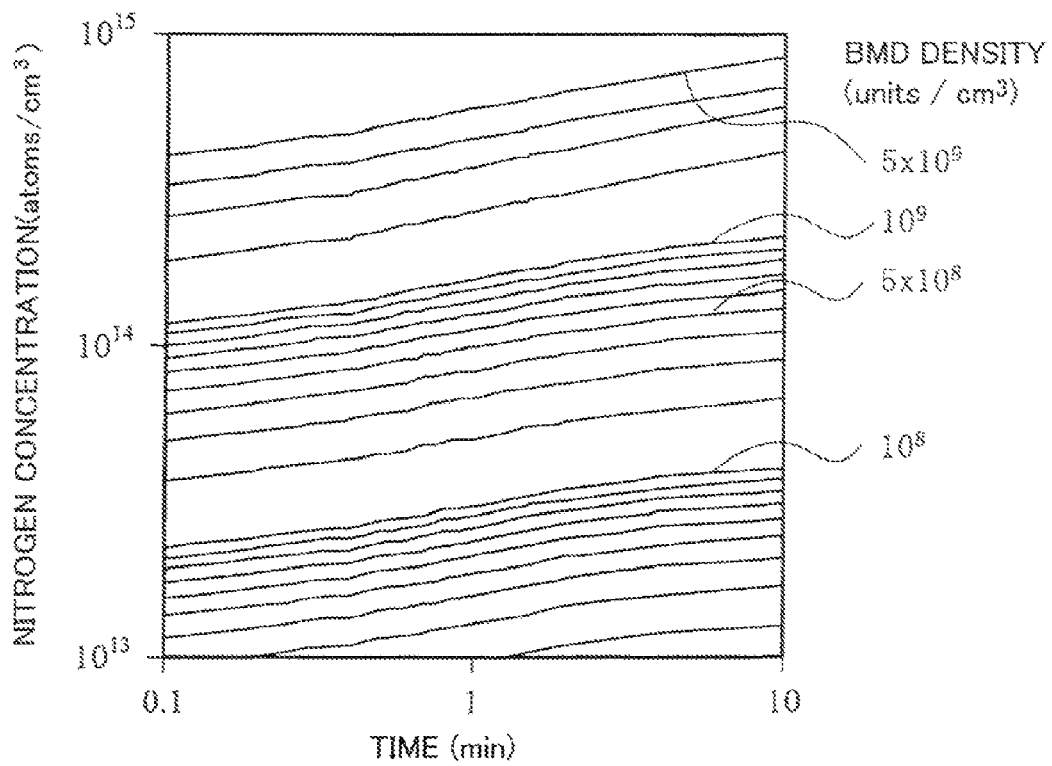
FIG. 9 shows the relation between the BMD density and the nitrogen concentration and time when the baking temperature in an epitaxial growth process is set to 1200° C.
Figure 10:
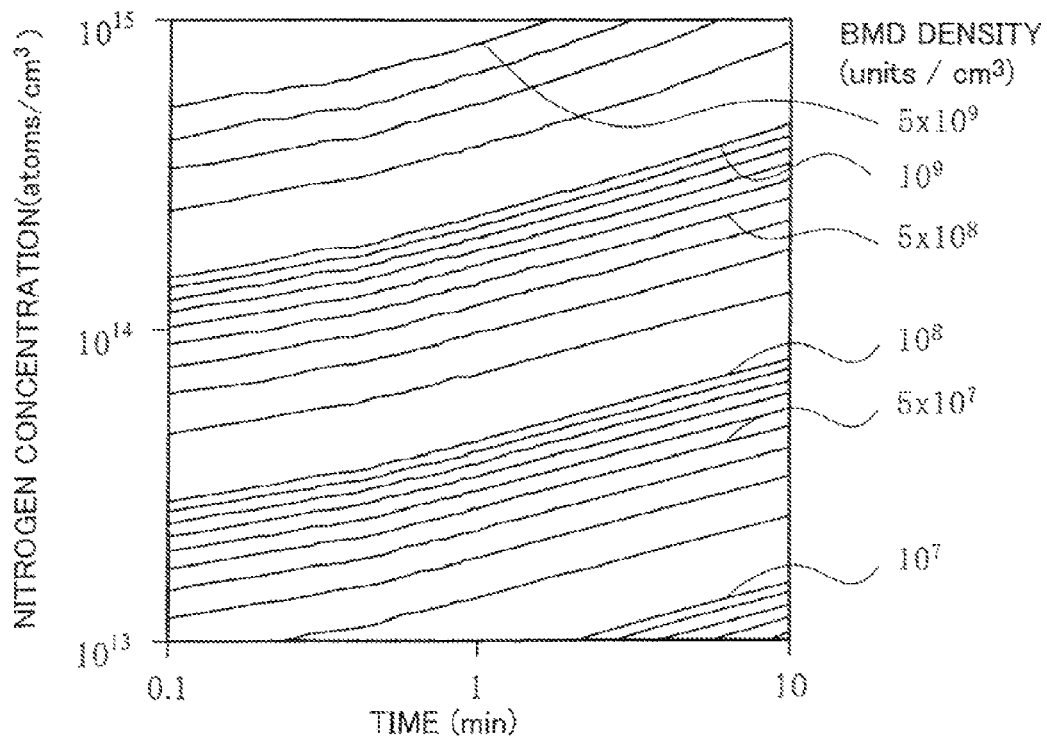
FIG. 10 shows the relation between the BMD density and the nitrogen concentration and time when the baking temperature in an epitaxial growth process is set to 1230° C.

FIGS. 8, 9 and 10 show the relation of the BMD density vs. the holding time at a given pre-process temperature and nitrogen concentration, when the cooling rate around 1100° C. during crystal growth was set to 3.5° C./minute, the oxygen concentration at the time was set to $12.0 \times 10^{17}$ atoms/cm$^3$, the thermal annealing time from 500° C. to the pre-process temperature was set to 1 minute, and the pre-process temperature was set to each of 1150° C., 1200° C., and 1230° C. The calculation method is as follows: the size distribution of as-grown oxygen precipitates is provided as an initial value by Equation 4).

Then, the growth and disappearance of the nuclei having differing radii in the temperature process in the epitaxial process are numerically calculated by Equation 2) and 3).

As a result, the density of the BMD nuclei that remain without disappearing is derived. Each of the contour lines in the figures represents a BMD density, and some of the lines are provided with their specific BMD density values. From these figures, conditions for obtaining a BMD density of $5 \times 10^8$ units/cm$^3$ or more can be selected. In the case where the pre-process temperature and the epitaxial growth temperature are the same, the total time of both processes corresponds to the time in FIGS. 8, 9 and 10. In the case where the temperatures are different from each other, the above calculation may be done by including the pre-process and the epitaxial growth process in the temperature process. However, in the case where the pre-process temperature is higher than the epitaxial growth temperature, FIGS. 8, 9 and 10 can be used as they are because the BMD density after the processes is determined at the stage of the pre-process.

Embodiment 2

An example in which the effects of the heat treatment temperature and time of pre-annealing performed before an epitaxial growth process and the nitrogen concentration on the BMD density are predicted by a method according to the present invention is shown. The calculation method is the same as that shown in Embodiment 1.

Figure 11:
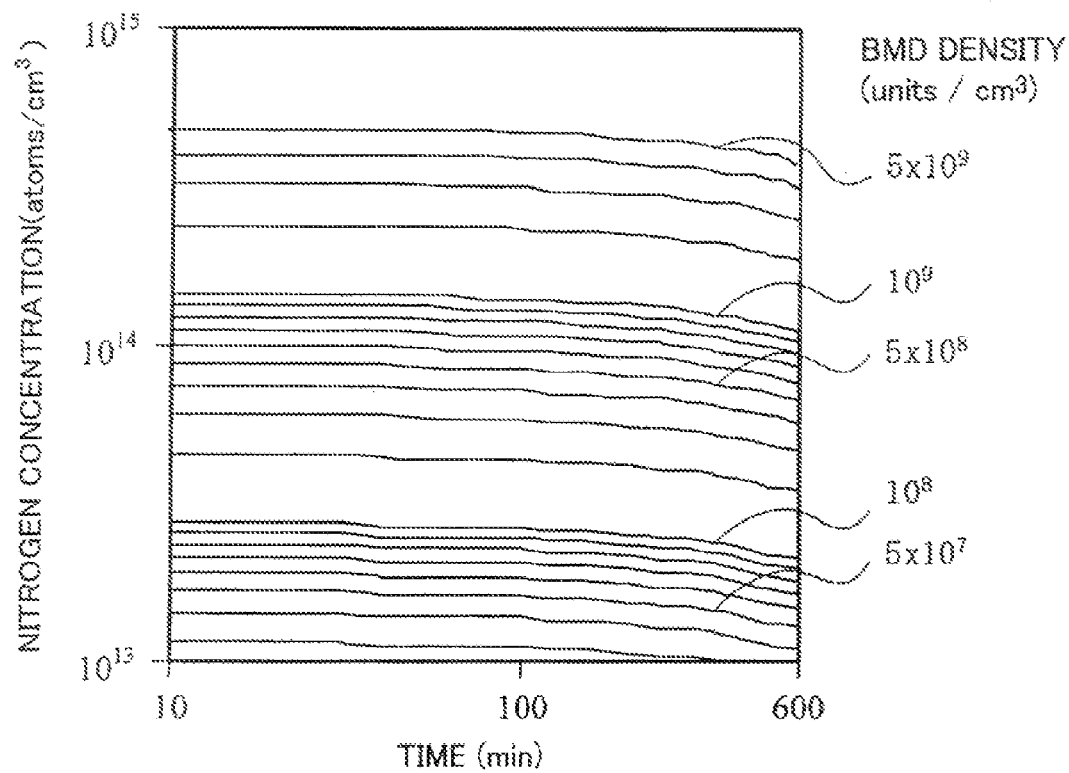
FIG. 11 shows the relation between the BMD density and the nitrogen concentration and time when the pre-annealing temperature before an epitaxial growth process is set to 750° C.
Figure 12:
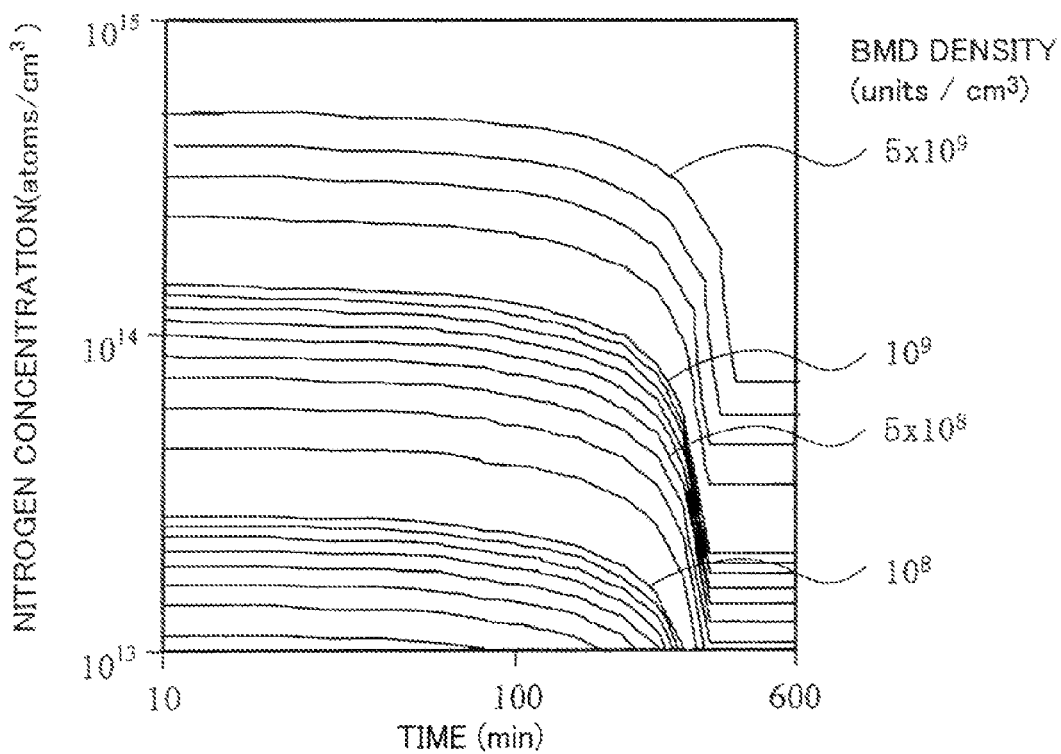
FIG. 12 shows the relation between the BMD density and the nitrogen concentration and time when the pre-annealing temperature before an epitaxial growth process is set to 800° C.
Figure 13:
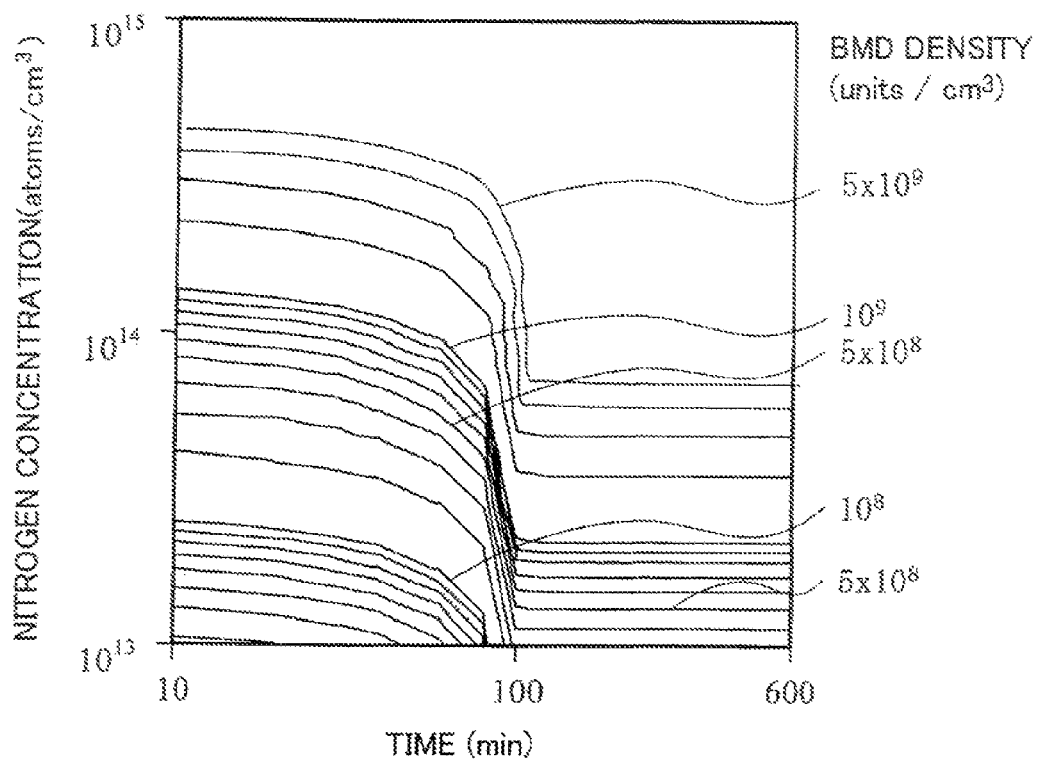
FIG. 13 shows the relation between the BMD density and the nitrogen concentration and time when the pre-annealing temperature before an epitaxial growth process is set to 850° C.

FIGS. 11, 12 and 13 show the relation of the BMD density vs. the annealing time and nitrogen concentration, when the cooling rate around 1100° C. during crystal growth was set to 3.5° C./minute, the oxygen concentration was set to $12.0 \times 10^{17}$ atoms/cm$^3$, the thermal annealing time from 500° C. in the epitaxial process was set to 1 minute, the epitaxial temperature was set to 1200° C., the epitaxial process time was set to 1 minute, and the pre-annealing temperature was set to each of 750° C., 800° C., and 850° C. Each of the contour lines in the figures represents a BMD density, and some of the lines are provided with their specific BMD density values. From these figures, the conditions for obtaining the BMD density of $5 \times 10^8$ units/cm$^3$ or more can be selected.

Embodiment 3

An example in which the effects of the heat treatment temperature and time of pre-annealing performed before the high-temperature annealing process and the nitrogen concentration on the BMD density are predicted by a method according to the present invention is shown.

Figure 14:
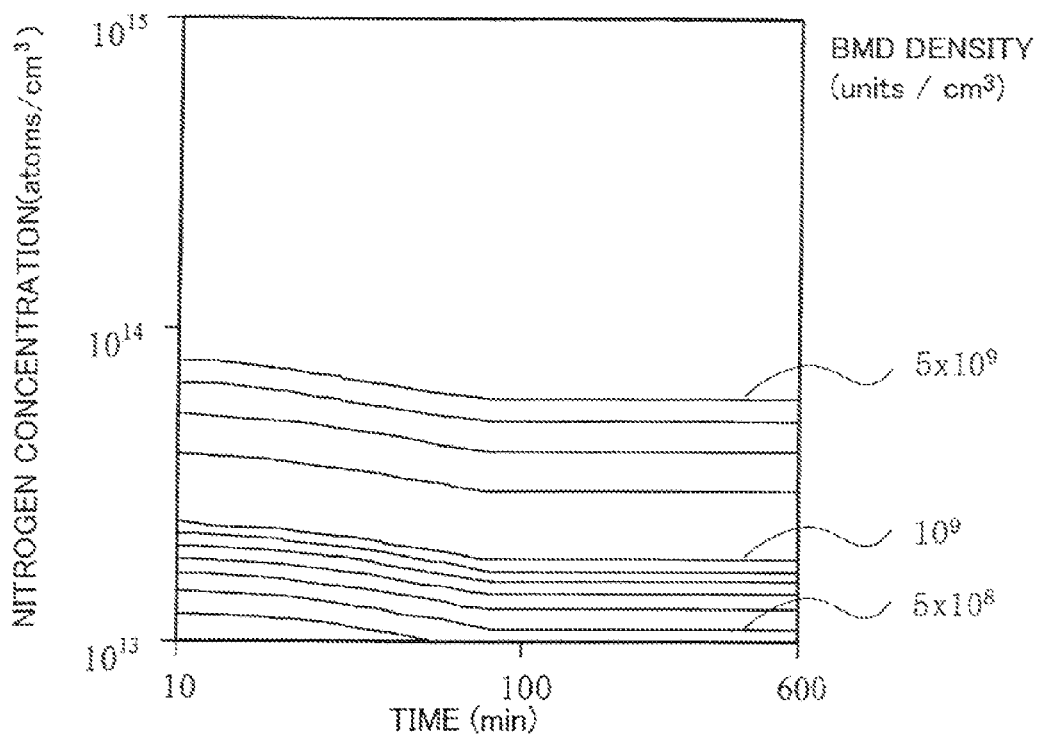
FIG. 14 shows the relation between the BMD density and the nitrogen concentration and time when the pre-annealing temperature before a high-temperature annealing process is set to 750° C.
Figure 15:
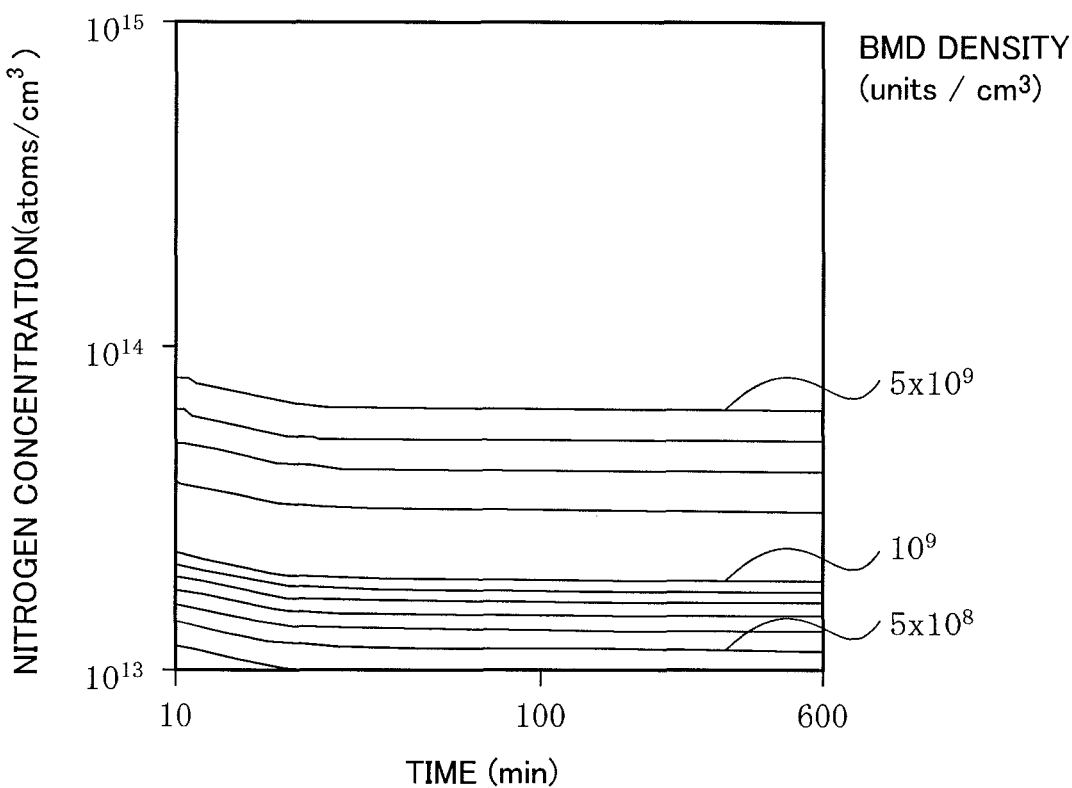
FIG. 15 shows the relation between the BMD density and the nitrogen concentration and time when the pre-annealing temperature before a high-temperature annealing process is set to 800° C.

The cooling rate around 1100° C. during crystal growth was set to 3.5° C./minute, and the oxygen concentration was set to $12.0 \times 10^{17}$ atoms/cm$^3$. FIGS. 14 and 15 show the relation of the BMD density vs. the annealing time and nitrogen concentration, when the pre-annealing temperature was set to each of 750° C. and 800° C., respectively in case of the thermal annealing rate from 800° C. to 1000° C. was set to 10° C./minute, the thermal annealing rate from 1000° C. was set to 1100° C. was set to 2° C./minute, the thermal annealing rate from 1100° C. to 1200° C. was set to 1° C./minute, and the holding time at 1200° C. was set to 1 hour in a high-temperature annealing process. Each of the contour lines in the figures represents a BMD density, and some of the lines are provided with their specific BMD density values. From these figures, the conditions for obtaining the BMD density of $5 \times 10^8$ units/cm$^3$ or more can be selected.

Embodiment 4

Figure 16:
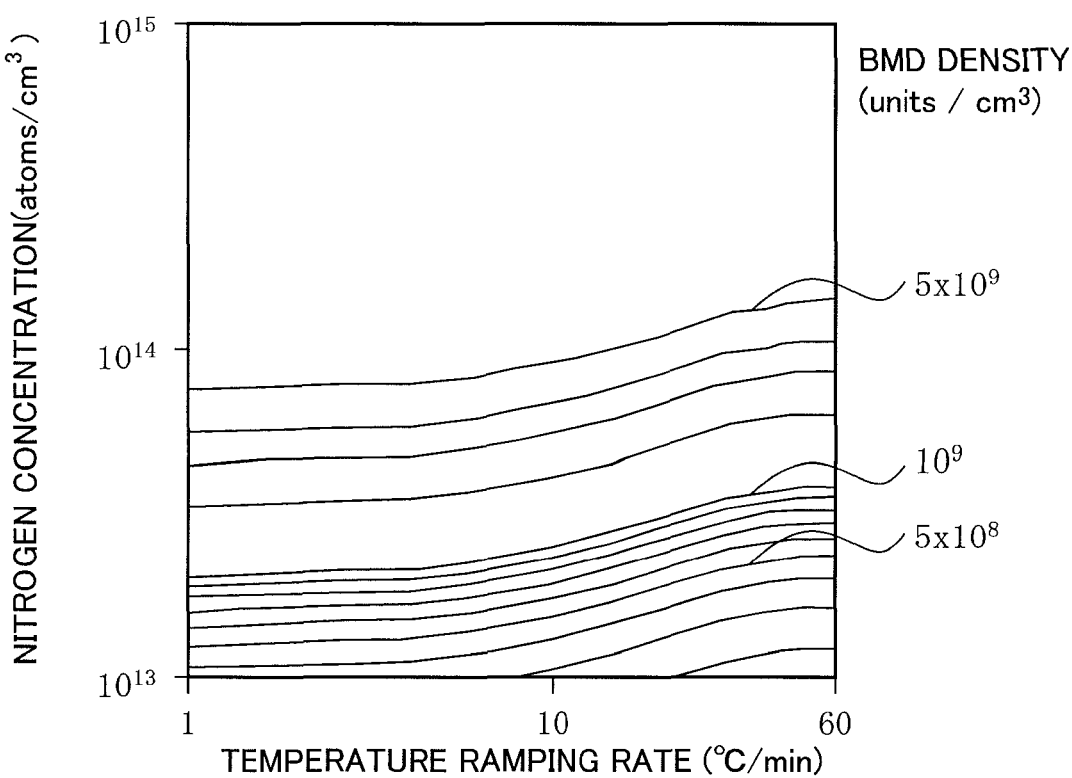
FIG. 16 shows the relation between the BMD density and the thermal annealing rate from 800° C. to 1000° C. in a high-temperature annealing process and nitrogen concentration.

An example in which the effects of the thermal annealing rate in a high-temperature annealing process and the nitrogen concentration on the BMD density are predicted by a method according to the present invention is shown. The result is shown in FIG. 16. The calculation method is the same as that shown in Embodiment 1.

the cooling rate around 1100° C. during crystal growth was set to 3.5° C./minute, and the oxygen concentration was set to $12.0 \times 10^{17}$ atoms/cm$^3$. In the high-temperature annealing process, the thermal annealing rate from 800° C. to 1000° C. was set to the one shown in the figure, the thermal annealing rate from 1000° C. to 1100° C. was set to 2° C./minute, the thermal annealing rate from 1100° C. to 1200° C. was set to 1° C./minute, and the holding time at 1200° C. was set to 1 hour. Each of the contour lines in the figures represents a BMD density, and some of the lines are provided with their specific BMD density values. From this figure, the conditions for obtaining the BMD density of $5 \times 10^8$ units/cm$^3$ or more can be selected.

Figure 17B:
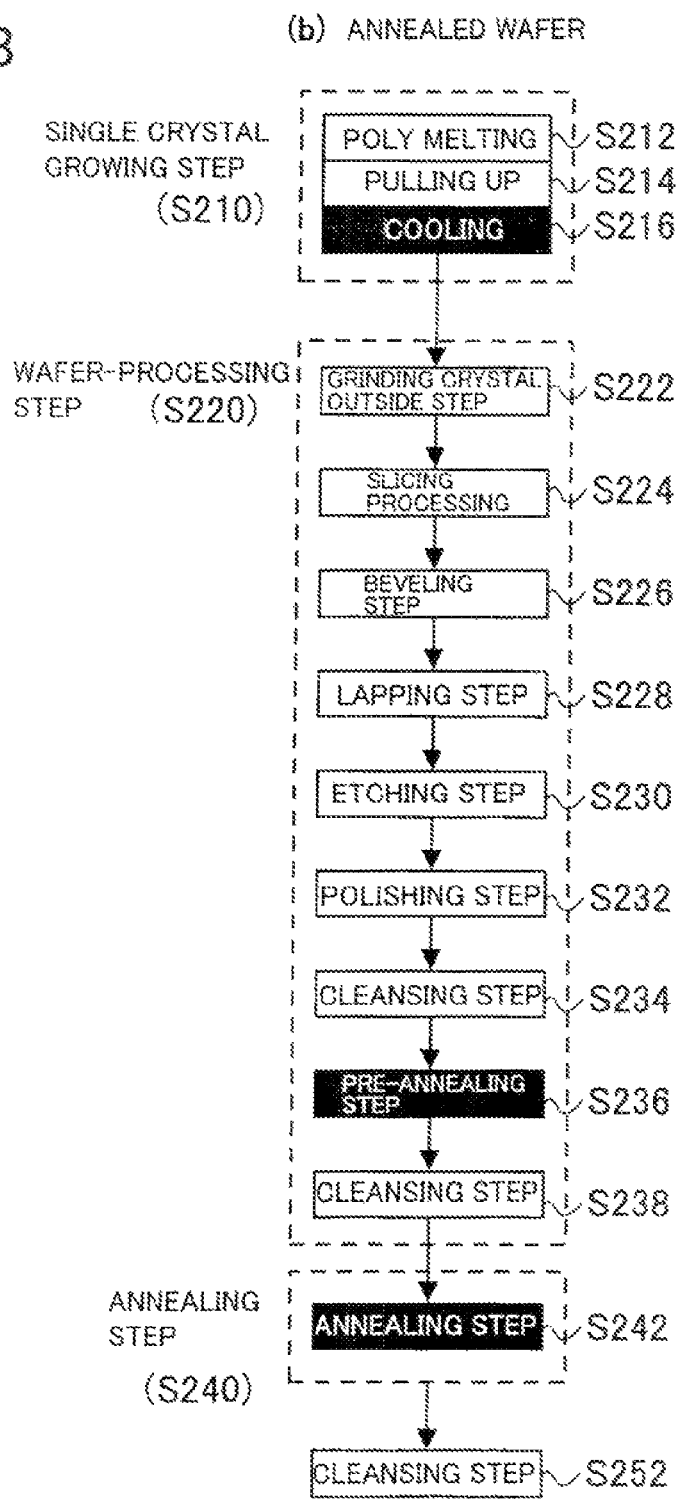
FIG. 17B shows a manufacturing process of an annealed wafer used in the embodiments.
Figure 18A:
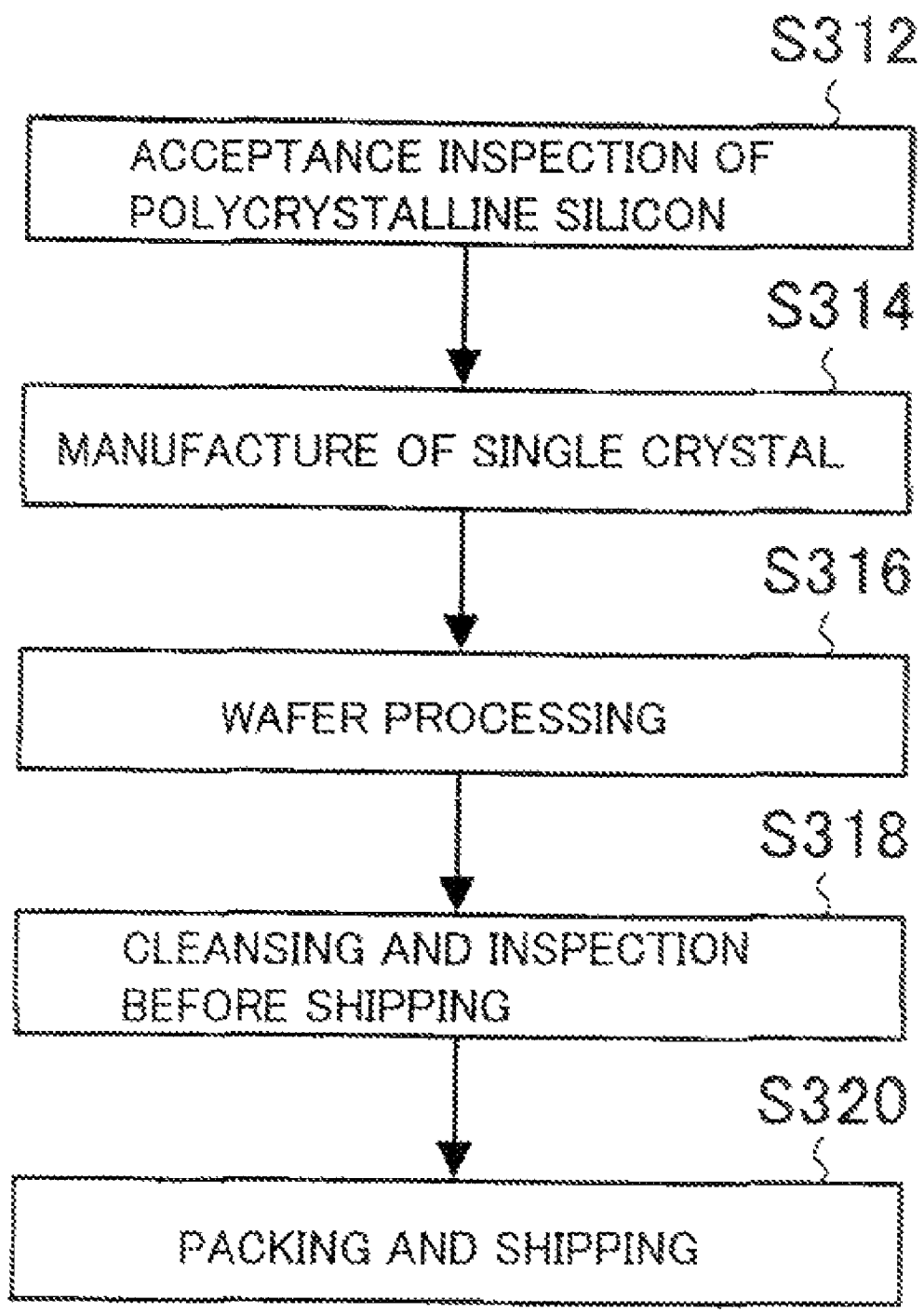
FIG. 18A shows a general manufacturing process of a mirror finished wafer.
Figure 18B:
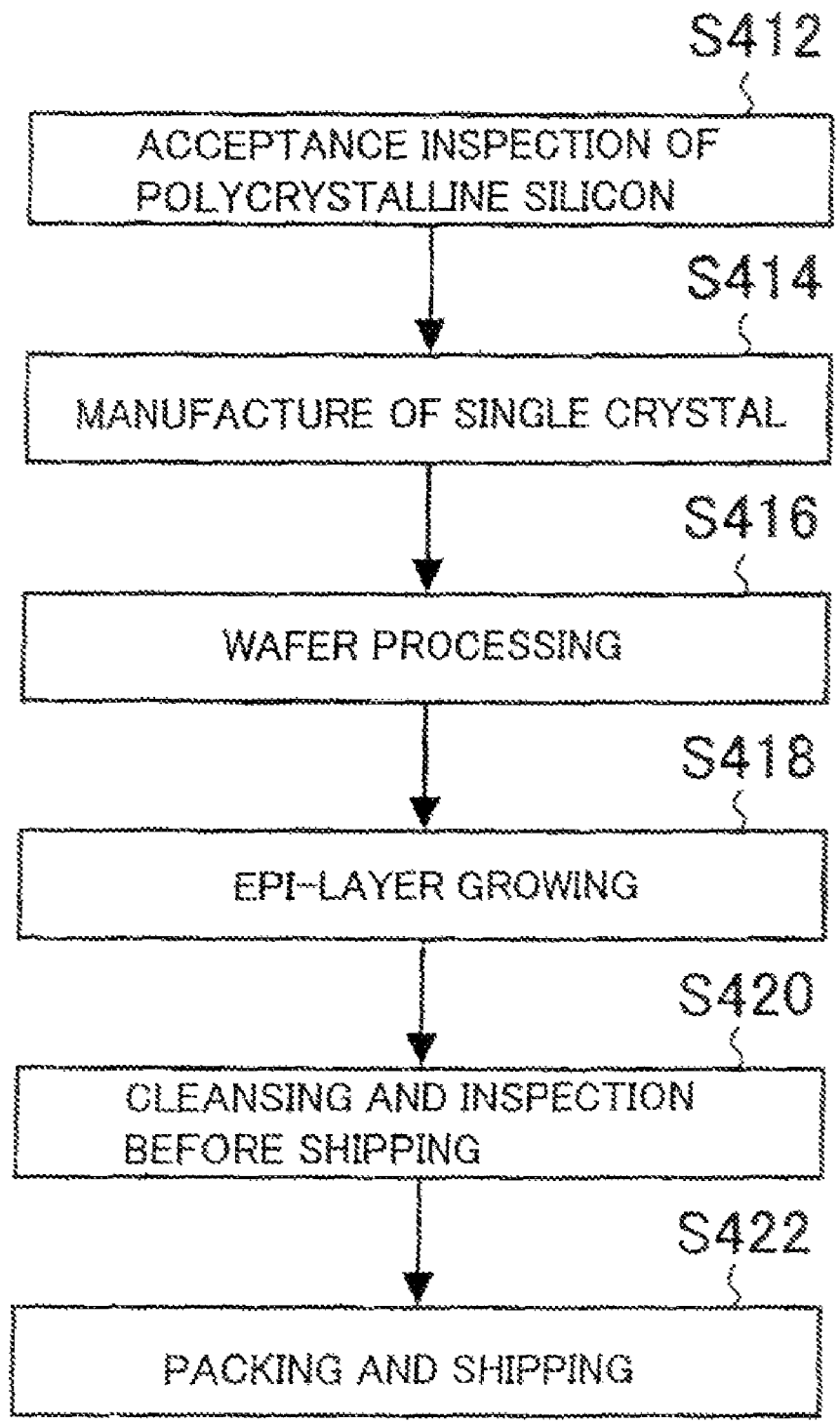
FIG. 18B shows a general manufacturing process of an epi-wafer.

Next, the BMD density values of silicon wafers actually processed were measured and were compared with their predicted values according to the present invention (Embodiments 5, 6, 7 and 8). The experiments were done in accordance with (a) the manufacturing process for an epitaxial wafer and (b) the manufacturing process for an annealed wafer as shown in FIGS. 17A and 17B, respectively. For reference, a general manufacturing process for a mirror finished wafer and a general manufacturing process for an epi-wafer are shown in FIGS. 18A and 18B, respectively. In the process of a mirror finished wafer, from a selected polycrystalline silicon (S312), a single crystal is manufactured (S314), a wafer cut out from this single crystal is wafer-processed (S316), is cleansed and inspected before shipping (S318), and is packed and shipped (S329). In this process, the cooling process in a predetermined temperature range at the time of manufacturing the single crystal is very important. Although a phenomenon occurring in this process is not clear, it is through to have an effect on the resulting BMD density, and this predetermined temperature range can be regarded as a temperature range in which the density of the oxygen precipitates increases. Although the temperature range in which the density of the oxygen precipitates increases is thought to be determined by various conditions such as oxygen concentration, nitrogen concentration, temperature gradient, etc., it is thought to be around 1100° C. under normal conditions in which a single crystal is manufactured by the CZ method or MCZ method. If the cooling rate in such a temperature range is extremely small as described above, a sufficient BMD density may not be obtained. Also, in a case where a heat treatment is performed in the processing step (S316), this heat treatment has an effect on the BMD density.

In the manufacturing process of an epi-wafer, from a polycrystalline silicon selected in the same manner (S412), a single crystal is manufactured (S414), a wafer cut out from this single crystal is processed (S416), an epi-layer is grown (S418), the wafer is cleansed and inspected before shipping (S420), and is packed and shipped (S422). As described above, the aforementioned cooling rate in the temperature range in which the density of the oxygen precipitates increases, the heat treatment in the wafer processing step (S416), and the temperature conditions in the epi-layer growing step (S418) are thought to have an effect on the resulting BMD density.

Embodiment 5

An example in which the effects of the heat treatment temperature and time of pre-annealing performed before the epi-step on the BMD density were actually measured is compared with an example of its prediction by the method according to the present invention. The result is shown in FIG. 19A. In the manufacturing process of an epitaxial wafer, first the single crystal growing step (S110) is performed, then the processing step (S120) is performed, the epitaxial step (S140) is performed, and lastly, the cleansing step (S152) is performed, the manufacture an epitaxial wafer, as shown in FIG. 17A. More specifically, in the single crystal growing step (S110), a polycrystalline silicon is melted (S112), and a single crystal ingot is pulled up (S114) while the ingot is cooled (S116). Next, in the wafer processing step (S120), grinding crystal outside step is performed (S122), ingot slicing processing is performed (S124), beveling of the sliced wafer is performed (S126), the surface is polished by lapping (S128), etching (S130) and polishing (S132), the wafer is cleansed (S134), is pre-annealed (S136), and is cleansed (S138), to move onto the subsequent epitaxial step (S140). In the epitaxial step, hydrogen baking is performed (S142), and the wafer is epitaxially grown (S144). The wafer is finished with the aforementioned cleansing (S152). In this process, the ingot cooling step (S116), the pre-annealing step (S136) and the hydrogen baking step (S142) have a particular effect on the BMD density. It is noted that the pre-annealing step (S136) may be performed before the polishing step (S132). In this example, the cooling rate in a range around 1100° C. was set to 3.5° C./minute in the ingot cooling step (S116), and the conditions for the pre-annealing are shown in FIG. 19A. The hydrogen baking conditions in the epitaxial step and other conditions are shown in FIG. 19B.

FIG. 19A shows the calculated and predicted values and the actual measured values of the BMD density. The highly correspond to each other, which shows that the above calculation is correct. Also, an evaluation in which a circle mark is given when the BMD density is $5 \times 10^8$ units/cm$^3$ or more while a cross mark is given when it is less than this value is shown.

Embodiment 6

An example in which the effects of the temperature and time of the hydrogen baking in the epi-step on the BMD density were actually measured is compared with an example of its prediction by the method according to the present invention. The result is shown in FIG. 20A. In the manufacturing process of an epitaxial wafer, the ingot cooling step (S116), the pre-annealing step (S136) and the hydrogen baking step (S142) have a particular effect on the BMD density. In this example, the pre-annealing was not performed. The cooling rate in a range around 1100° C. was set to 3.5° C./minute. The hydrogen baking conditions are shown in FIG. 20A. Other conditions in the epitaxial step are shown in FIG. 20B.

FIG. 20A shows the calculated and predicted values and the actual measured values of the BMD density. They highly correspond to each other, which shows that the above calculation is correct. Also, an evaluation in which a circle mark is given when the BMD density is $5 \times 10^8$ units/cm$^3$ or more while a cross mark is given when it is less than this value is shown.

Embodiment 7

An example in which the effects of the heat treatment temperature and time of pre-annealing performed before a high-temperature annealing step on the BMD density were actually measured is compared with an example of its prediction by the method according to the present invention. The result is shown in FIG. 21A. An annealed wafer was manufactured in accordance with the aforementioned process (FIG. 17B). The manufacturing process of an annealed wafer consists of a single crystal growing step (S210), a processing step (S220), an annealing step (S240) and a cleansing step (S252). More specifically, in the single crystal growing step (S210), a polycrystalline silicon is melted (S212), and a single crystal ingot is pulled up (S214) while the ingot is cooled (S216). Next, in the processing step (S220), grinding crystal outside step is performed (S222), ingot slicing processing is performed (S224), beveling of the sliced wafer is performed (S226), the surface is polished by lapping (S228), etching (S230) and polishing (S232), the wafer is cleansed (S234), is pre-annealed (S236), and is cleansed (S238), to move onto the subsequent annealing step (S242). The wafer is finished with the aforementioned cleansing (S252). In this process, the ingot cooling step (S216), the pre-annealing step (S236) and the annealing step (S242) have a particular effect on the BMD density.

The cooling rate in a range around 1100° C. was set to 3.5° C./minute, and in the annealing step, the high-temperature annealing was performed at 1200° C. for 1 hour, and the thermal annealing rate from 800° C. to 1000° C. was set to 10° C./minute. The conditions for the pre-annealing and the other conditions in the manufacturing process of an annealed wafer are shown in FIG. 21B.

FIG. 21A shows calculated and predicted values and actual measured values of the BMD density. They highly correspond to each other, which shows that the above calculation is correct. Also, an evaluation in which a circle mark is given when the BMD density is $5 \times 10^8$ units/cm$^3$ or more while a cross mark is given when it is less than this value is shown.

Embodiment 8

An example in which the effects of the thermal annealing rate in the high-temperature annealing step on the BMD density were actually measured is compared with an example of its prediction by the method according to the present invention. The result is shown in FIG. 22A. In the manufacturing process of an annealed wafer, the ingot cooling step (S216), the pre-annealing step (S236) and the annealing step (S242) have a particular effect on the BMD density. Thus, the cooling rate in a range around 1100° C. was set to 3.5° C./minute, and in the annealing step, the high-temperature annealing was performed at 1200° C. for 1 hour. The thermal annealing rate form 800° C. to 1000° C. in the high-temperature annealing and the other conditions in the manufacturing process of an annealed wafer are shown in FIG. 22B.

FIG. 22A shows the calculated and predicted values and the actual measured values of the BMD density. They highly correspond to each other, which shows that the above calculation is correct. Also, an evaluation in which a circle mark is given when the BMD density is $5 \times 10^8$ units/cm$^3$ or more while a cross mark is given when it is less than this value is shown.

As described above, the present invention provides the following.

(1) A method comprising the steps of: deriving a relational equation relating the density to the radius of an oxygen precipitate introduced in a silicon single crystal doped with nitrogen at the time of crystal growth from a nitrogen concentration and a cooling rate in a temperature range in which the density of the oxygen precipitates increases during crystal growth; and predicting the oxygen precipitate density to be obtained after a heat treatment from the derived relational equation relating the oxygen precipitate density to the radius, the oxygen concentration, and the temperature process of the heat treatment.

By the above method, the following silicon wafer can be provided. That is, it is a silicon wafer manufactured by deriving a relational equation relating the density to the radius of an oxygen precipitate introduced in a silicon single crystal doped with nitrogen at the time of crystal growth from a nitrogen concentration and a cooling rate in a temperature range in which the density of the oxygen precipitates increases during crystal growth, predicting the oxygen precipitate density using the above relational equation, nitrogen concentration, oxygen concentration, and a temperature process of a heat treatment, adjusting the nitrogen concentration, the oxygen concentration, and the temperature process of the heat treatment so that the above predicted density becomes a predetermined value, and using the obtained nitrogen concentration, oxygen concentration, and temperature process of the heat treatment as manufacturing conditions.

Meanwhile, nitrogen doping in the silicon single crystal can be done by doping nitrogen or a compound containing nitrogen or the like in molten silicon, and the nitrogen concentration in the silicon single crystal can be determined by these doping conditions and the crystal growth conditions, etc. An oxygen precipitate introduced at the time of crystal growth is an oxide precipitated in the crystal grown form the molten silicon and can include one grown to a measurable size. This size can be expressed by using its radius, assuming that the precipitate is spherical. Also, the oxygen precipitate density can mean the number of the precipitates per unit volume of the crystal, and the nitrogen concentration used here can mean the amount of nitrogen per unit volume of the crystal. The temperature range in which the density of the oxygen precipitates increases during crystal growth may be a temperature range in which the density of the oxygen precipitates significantly increases in a process in which the temperature is lowered along with crystal growth, for example, and its minimum and maximum temperature and the temperature range may; be changed depending on various conditions.

(2) The method according to the above (1), wherein the temperature range in which the density of the oxygen precipitates increases during crystal growth is around 1100° C.

Also, a silicon wafer can be provided which is the above silicon wafer wherein the temperature range in which the density of the oxygen precipitates increases during crystal growth is around 1100° C.

Here, "around 1100° C." may mean a temperature range around 1100° C.

(3) The method according to the above (1) or (2), wherein the temperature process of the heat treatment is a temperature process in epitaxial growth or a temperature process in annealing at a temperature of 1100° C. or more.

(4) A method for deriving a relational equation relating the density to the radius of an oxygen precipitate introduced in a silicon crystal doped with nitrogen at the time of crystal growth from the nitrogen concentration and the cooling rate around 1100° C. during crystal growth, and predicting the oxygen precipitate density to be obtained after the heat treatment from the derived relational equation relating the oxygen precipitate density to the radius, the oxygen concentration, and the temperature process in epitaxial growth.

(5) A method for deriving a relational equation relating the density to the radius of an oxygen precipitate introduced in a silicon crystal doped with nitrogen at the time of crystal growth from the nitrogen concentration, and the cooling rate around 1100° C. during crystal growth, and predicting the oxygen precipitate density to be obtained after the heat treatment from the derived relational equation relating the oxygen precipitate density to the radius, the oxygen concentration, and the temperature process in annealing at a temperature of 1100° C. or more.

(6) A method for manufacturing an epitaxially grown wafer by pulling up a silicon ingot by the CZ method or MCZ method, cutting out a silicon wafer from the ingot, pre-annealing the silicon wafer, performing hydrogen baking, and performing epitaxial growth on the silicon wafer, comprising the steps of: determining the density of oxygen precipitates appropriate for an intended application of the epitaxially grown wafer; and, based on an oxygen and nitrogen concentration obtained, determining a cooling rate at the time of pulling up the silicon ingot, an temperature and holding time of pre-annealing, and a temperature and holding time of hydrogen baking by a predetermined relational equation.

(7) A method for determining the density of oxygen precipitates appropriate for application of an epitaxially grown wafer or a high-temperature annealed silicon wafer to be manufactured by pulling up a silicon ingot by the CZ method or MCZ method, cutting out a silicon wafer from the ingot, and pre-annealing the silicon wafer, and, based on the oxygen and nitrogen concentration, determining the cooling rate at the time of pulling up the silicon ingot, the temperature and holding time of pre-annealing, and the temperature and holding time of hydrogen baking for the epitaxially grown wafer or the thermal annealing rate in a predetermined temperature range of high-temperature annealing for the high-temperature annealed silicon wafer by a predetermined relational equation, so that the determined density of oxygen precipitates is obtained.

(8) A wafer manufactured under the conditions determined by the above method (7).

Here, the predetermined relational equation may include a relation equation relating the density to the radius of an oxygen precipitate introduced at the time of crystal growth. It may also include a relation equation in which the nitrogen concentration and the cooling rate in a temperature range in which the density of the oxygen precipitates increases during crystal growth can be used as variables.

(9) A method for manufacturing a product silicon wafer by pulling up a silicon ingot by the CZ method or MCZ method, cutting out a silicon wafer from the ingot, pre-annealing the silicon wafer, and performing high-temperature annealing, comprising the step of: determining the density of oxygen precipitates appropriate for an intended application of the product silicon wafer; and, based on an oxygen and nitrogen concentration obtained, determining a cooling rate at the time of pulling up the silicon ingot, a temperature and holding time of pre-annealing, and a thermal annealing rate in a predetermined temperature range of high-temperature annealing by a predetermined relational equation.

Here, the predetermined temperature range of high-temperature annealing may include a temperature range that can have an effect on the increase of the oxygen precipitate density. The specific temperature range is determined by various conditions.

(10) A program for predicting the density of oxygen precipitates in a silicon wafer, prompting for input of a cooling rate in a temperature range in which the density of oxygen precipitates introduced at the time of crystal growth in a silicon single crystal as a raw material of the silicon wafer increases, a nitrogen concentration and/or an oxygen concentration in the silicon single crystal, and/or nitrogen concentration, calculating the oxygen precipitate density to be obtained after a heat treatment by a predetermined relational equation expressing the density to the radius of the oxygen precipitate introduced at the time of crystal growth by using data of a temperature process that the silicon wafer undergoes, and outputting a result of the calculation.

(11) A recording medium recording the program according to the above (10).

(12) A wafer manufactured by the manufacturing method according to the above (6) or (7).

(13) An epitaxially grown wafer manufactured by a method for manufacturing an epitaxially grown wafer comprising a step of controlling various conditions by using the prediction method according to any one of the above (1) to (3), so that a predetermined oxygen precipitate density is obtained.

Here, the various conditions to be controlled my include conditions that can have an effect on an increase of the oxygen precipitate density. For example, they can include temperature conditions such as the thermal annealing rate, the cooling rate, the holding temperature, holding time etc. in one or more steps in the manufacture of a silicon wafer, the component conditions such as the material components and other components, and the manufacturing conditions such as the pulling rate, the supply rate, atmosphere etc.

(14) A silicon wafer whose oxygen precipitate density is controlled to an appropriate density based on the conditions predicted by the method according to the above (1), (2) or (4).

(15) A wafer annealed at a temperature of 1100° C. or more whose oxygen precipitate density is controlled to an appropriate density based on the conditions predicted by the method according to the above (5).

(16) A silicon wafer whose oxygen precipitate density is $5 \times 10^8$ units/cm$^3$ or more based on the conditions predicted by the method according to the above (1), (2) or (4), setting the cooling rate around 1100° C. during crystal growth to 0.76° C./minute or faster. Also, it is possible to provide a method for making the oxygen precipitate density in a silicon wafer to be manufactured $5 \times 10^8$ units/cm$^3$ or more by setting the cooling rate around 1100° C. during crystal growth to 0.76° C./minute or faster, and using conditions predicted by the method according to the above (1), (2) or (4).

(17) An epitaxially grown wafer whose oxygen precipitate density is $5 \times 10^8$ units/cm$^3$ or more, setting the maximum temperature and time in an epitaxial growth process as predicted by the above method (4), when the cooling rate around 1100° C. during crystal growth is set to 0.76° C./minute or faster.

(18) An epitaxially grown wafer whose oxygen precipitate density is $5 \times 10^8$ units/cm$^3$ or more, setting the temperature and time of a heat treatment performed before an epitaxial growth process as predicted by the above method (4), when the cooling rate around 1100° C. during crystal growth is set to 0.76° C./minute or faster.

(19) A wafer annealed at a temperature of 1100° C. or more whose oxygen precipitate density is $5 \times 10^8$ units/cm$^3$ or more, using the conditions predicted by the above method (5), when the cooling rate around 1100° C. during crystal growth is set to 0.76° C./minute or faster.

(20) A wafer annealed at a temperature of 1100° C. or more whose oxygen precipitate density is $5 \times 10^8$ units/cm$^3$ or more, setting the temperature and time of a heat treatment performed before annealing at a temperature of 1100° C. or more as predicted by the above method (5), when the cooling rate around 1100° C. during crystal growth is set to 0.76° C./minute or faster.

(21) A wafer annealed at a temperature of 1100° C. or more whose oxygen precipitate density is $5 \times 10^8$ units/cm$^3$ or more, setting the thermal annealing rate in the thermal annealing process at 700° C. or more and 900° C. or less in the annealing process to a temperature of 1100° C. or more as predicted by the above method (5), when the cooling rate around 1100° C. during crystal growth is set to 0.76° C./minute or faster.

It is to be understood that the present invention is not limited by the embodiments described here.

to control the resistance of a CZ silicon crystal, B, P, As, Sb etc. as well as oxygen and nitrogen are doped in the CZ silicon crystal. It is well known that increasing the doping concentration will have an effect on the oxygen precipitate. The present invention can be applied to a p-type crystal is low, that is, in which the resistivity is 0.5 Ωcm or more. Predictions concerning the oxygen precipitates in a crystal having a lower resistivity can be made accurately as described in the present invention by evaluating the as-grown nucleus distribution at each resistivity or doping concentration in accordance with the procedures of the present invention.

The invention claimed is:

1. A method for manufacturing a nitrogen doped silicon wafer from a silicon single crystal doped with nitrogen, the method comprising the steps of:
   (1) evaluating a first relationship, said first relationship being a relationship of density of oxygen precipitates (as-grown precipitates) to a heating temperature of a silicon single crystal when a nitrogen concentration of the silicon single crystal is changed under a heat treatment condition that remains constant and at a predetermine oxygen concentration, said evaluating step including a numerical calculation to obtain a radius of each of the oxygen precipitates (as-grown precipitates) that can remain in a heating experiment based on the heat treatment condition; and
   (2) deriving a second relationship, said second relationship being a relationship for treating relational equations, using a variable of which at least the nitrogen concentration of the silicon single crystal and a cooling rate in a first temperature range in which the density of the oxygen precipitates (as grown precipitates) increases during crystal growth, the relationship relating the density to the radius of the oxygen precipitate (as grown precipitates), introduced in the silicon single crystal doped with nitrogen at the time of crystal growth, based on the step of evaluating a first relationship;
   wherein an oxygen concentration of the silicon single crystal and density of oxygen precipitates to be obtained after a heat treatment depending on each condition of a temperature process during epitaxial growth or annealing at a temperature of 1100° C. or more are determined by calculating and predicting the density of the oxygen precipitates using the numerical calculation of the evaluating step by using the first relationship, which relates the density to the radius of the oxygen precipitates, the first relationship having been obtained in the evaluating step, and
   wherein the density of the oxygen precipitates to be obtained after the heat treatment is controlled to a predetermined value by controlling the nitrogen concentration, the predetermined oxygen concentration and the temperature process of the heat treatment, and the density of the oxygen precipitates being obtained under conditions for obtaining a density of oxygen precipitates of $5\times10^8$ units/cm$^3$ after a heat treatment by using the nitrogen concentration, the predetermined oxygen concentration and each condition of the temperature process of the heat treatment.

2. The method according to claim 1, wherein the first temperature range, in which the density of the oxygen precipitates increases during crystal growth, is from 1150° C. to 1020° C.

3. A nitrogen doped silicon wafer manufactured from a silicon single crystal doped with nitrogen, wherein
an epitaxially grown wafer or a high-temperature annealed silicon wafer is manufactured by pulling up a silicon ingot by the CZ method or MCZ method, cutting out a silicon wafer from the ingot, and pre-annealing the silicon wafer,
wherein density of oxygen precipitates appropriate for an intended application of the epitaxially grown wafer or the high-temperature annealed silicon wafer is determined using the method according to claim 1,
wherein, based on the oxygen and nitrogen concentration during growth of the silicon single crystal, a cooling rate at the time of pulling up the silicon ingot, a temperature and holding time of pre-annealing, and a temperature and holding time of hydrogen baking for the epitaxially grown wafer or a thermal annealing rate in a predetermined temperature range of high-temperature annealing for the high-temperature annealed silicon wafer are determined, so that the determined density of oxygen precipitates is obtained, and
wherein a wafer with a density of oxygen precipitates of $5\times10^8$ units/cm$^3$ or more is manufactured under conditions determined in the foregoing.

4. A nitrogen doped silicon wafer whose density of oxygen precipitates is controlled to $8\times10^8$ units/cm$^3$ or more based on conditions predicted by the method according to claim 1.

5. A nitrogen doped silicon wafer whose density of oxygen precipitates is $5\times10^8$ units/cm$^3$ or more using the method according to claim 1, wherein a cooling rate is set to 0.76° C./minute or faster in a temperature range of from 1150° C. to 1020° C. during crystal growth.

6. A nitrogen doped silicon wafer whose density oxygen precipitates is controlled to $8\times10^8$ units/cm$^3$ or more using the method according to claim 2.

7. A nitrogen doped silicon wafer whose density oxygen precipitates is $5\times10^8$ units/cm$^3$ or more using the method according to claim 2, wherein a cooling rate is set to 0.76° C./minute or faster in a temperature range of from 1150° C. to 1020° C. during crystal growth.

8. A method for manufacturing a silicon wafer from a silicon single crystal doped with nitrogen, the method comprising the steps of:
setting a cooling rate around 1100° C. during crystal growth, after measurement with a heat transfer analysis or a thermocouple;
setting a size distribution of an oxygen precipitate in an as-grown state in the silicon single crystal, using a nitrogen concentration in the silicon single crystal and the cooling rate, using a first equation and a second equation, wherein
the first equation is given by $$BMD = 6.4 \times 10^{-19} N^{1.39} R^{-1.163},$$

where BMD is a density of the as-grown oxygen precipitates (units/cm$^3$), N is the nitrogen concentration (atoms/cm$^3$), and R is a radius of the as-grown oxygen precipitate, and the second equation is given by $$\text{Saturation BMD density} = 7.5 \times 10^8 \, CR^{1.5},$$

where CR is the cooling rate around 1100° C. during crystal growth (° C./minute); and
setting an oxygen precipitate density using a program calculated by a third equation and a fourth equation relating at least one of growth and disappearance of the oxygen precipitate in a heat treatment process of the silicon wafer with the size distribution of the oxygen precipitate,
wherein the third equation is given by $$dR/dt = D\Omega(Co - Co^i)/R, \text{ and}$$

the fourth equation is given by $$Co^i = Co^{eq} \exp(2\Omega\sigma/Rk_\beta T),$$

where R is a radius of the oxygen precipitate, D is a diffusion coefficient of oxygen, $\Omega$ is a volume of $SiO_2$ per oxygen atom, Co is an oxygen concentration, $Co^i$ is an oxygen concentration at an interface of the precipitate, $Co^{eq}$ is a thermal equilibrium concentration of oxygen, $\sigma$ is a surface energy between $SiO_2$ and silicon, $k_\beta$ is the Boltzmann constant, and T is an absolute temperature.

9. A method for manufacturing a nitrogen doped silicon wafer from a silicon single crystal doped with nitrogen, the method comprising the steps of:
evaluating a relationship of density of oxygen precipitates (as-grown precipitates) to a heating temperature of a silicon single crystal when a nitrogen concentration of the silicon single crystal is changed under a heat treatment condition that remains constant and at the predetermined oxygen concentration, said evaluating step including a numerical calculation to obtain a radius of each of the oxygen precipitates (as-grown precipitates) that can remain in a heating experiment based on the heat treatment condition; and
deriving a relationship for treating relational equations, using a variable of which at least the nitrogen concentration of the silicon single crystal and a cooling rate in a temperature range in which the density of the oxygen precipitates (as-grown precipitates) increases during crystal growth, the relationship relating the density to the radius of the oxygen precipitate (as-grown precipitates), introduced in the silicon single crystal doped with nitrogen at the time of crystal growth, based on the evaluating step;
wherein an oxygen concentration of the silicon single crystal and density of oxygen precipitates to be obtained after a heat treatment depending on each conditions of a temperature process during epitaxial growth or annealing at a temperature of 1100° C. or more are determined by calculating and predicting the density of the oxygen precipitates using the numerical calculation of the evaluating step by using the relationship relating the density to the radius of the oxygen precipitates, obtained in the evaluating step,
wherein the density of the oxygen precipitates to be obtained after the heat treatment is controlled to a predetermined value by controlling the nitrogen concentration, the predetermined oxygen concentration and the temperature process of the heat treatment, and the density of the oxygen precipitates is obtained under conditions for obtaining a density of oxygen precipitates of $5\times10^8$ unites/cm$^3$ after a heat treatment by using the nitrogen concentration, the predetermined oxygen concentration and the each conditions of the temperature process of the heat treatment, wherein the numerical calculation in the evaluating step uses a first equation and a second equation relating at least one of growth and disappearance of the oxygen precipitate in a heat treatment process of the silicon wafer wherein the first equation is given by $$dR/dt = D\Omega(Co - Co^i)/R, \text{ and}$$

the second equation is given by $$Co^i Co^{eq} \exp(2\Omega\sigma/Rk_\beta T),$$

where R is a radius of the oxygen precipitate, D is a diffusion coefficient of oxygen, $\Omega$ is a volume of $SiO_2$ per oxygen atom, Co is an oxygen concentration, $Co^i$ is an oxygen concentration at an interface of the precipitate, $Co^{eq}$ is a thermal equilibrium concentration of oxygen, $\sigma$ is a surface energy between $SiO_2$, and silicon, k is the Boltzmann constant, and T is an absolute temperature; and wherein the relational equations in the deriving the relationship is uses a third equation and a fourth equation, wherein the third equation given by $$BMD = 6.4 \times 10^{-19} N^{1.39} R^{-1.163},$$

where BMD is a density of the as-grown oxygen precipitates (units/cm³), N is the nitrogen concentration (atoms/cm³), and R is a radius of the as-grown oxygen precipitate, and wherein the fourth equation given by $$\text{Saturation BMD density} = 7.5 \times 10^8 CR^{1.5},$$

where CR is the cooling rate around 1100° C. during crystal growth (° C./minute).

* * * * *